US010726921B2

(12) United States Patent
Hsiung et al.

(10) Patent No.: US 10,726,921 B2
(45) Date of Patent: Jul. 28, 2020

(54) INCREASED TERRACE CONFIGURATION FOR NON-VOLATILE MEMORY

(71) Applicant: SanDisk Technologies LLC, Plano, TX (US)

(72) Inventors: Chia-Lin Hsiung, Campbell, CA (US); Fumiaki Toyama, Cupertino, CA (US); Tai-Yuan Tseng, Milpitas, CA (US); Yan Li, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/942,044

(22) Filed: Mar. 30, 2018

(65) Prior Publication Data

US 2019/0088335 A1 Mar. 21, 2019

Related U.S. Application Data

(60) Provisional application No. 62/560,532, filed on Sep. 19, 2017.

(51) Int. Cl.
G11C 11/34 (2006.01)
G11C 16/08 (2006.01)
H01L 27/11556 (2017.01)
H01L 23/528 (2006.01)
G11C 16/04 (2006.01)
H01L 27/11582 (2017.01)
G11C 11/56 (2006.01)

(52) U.S. Cl.
CPC .......... G11C 16/08 (2013.01); G11C 11/5621 (2013.01); G11C 11/5671 (2013.01); G11C 16/0458 (2013.01); G11C 16/0483 (2013.01); H01L 23/528 (2013.01); H01L 27/11556 (2013.01); H01L 27/11582 (2013.01); G11C 16/0408 (2013.01); G11C 16/0466 (2013.01)

(58) Field of Classification Search
CPC . G11C 16/08; G11C 11/5621; G11C 11/5671; G11C 16/0458; G11C 16/0483; H01L 23/528; H01L 27/11556; H01L 27/11582
USPC .......................... 365/185.11, 230.06, 230.03
See application file for complete search history.

(56) References Cited

U.S. PATENT DOCUMENTS 9,123,392 B1 * 9/2015 Yan .................... G11C 13/0021
9,478,743 B2 * 10/2016 Lee ....................... H01L 51/0021
9,721,663 B1 * 8/2017 Ogawa ............... G11C 16/0483
9,806,093 B2 * 10/2017 Toyama ............ H01L 27/11524
9,929,174 B1 * 3/2018 Mizutani ............. H01L 27/1157
10,115,440 B2 * 10/2018 Nguyen ................ G11C 16/08
10,256,248 B2 * 4/2019 Lu ....................... H01L 21/4846
10,319,680 B1 * 6/2019 Sel ...................... H01L 23/5329

(Continued)

Primary Examiner — Viet Q Nguyen
(74) Attorney, Agent, or Firm — Vierra Magen Marcus LLP

(57) ABSTRACT

A three-dimensional block includes a stack comprising a plurality of control gate layers configured to bias memory cells of the block. The block includes a plurality of track regions that includes three or more hookup regions. The plurality of track regions separate the memory cells into three memory cell regions. Tracks extending in the track regions supply voltages to the hookup regions. A system includes a memory plane of blocks, and a plurality of track regions, each extending across the memory plane of blocks.

17 Claims, 19 Drawing Sheets

(56) References Cited

U.S. PATENT DOCUMENTS

| | | | |
|---|---|---|---|
| 2013/0336038 A1* | 12/2013 | Cernea | H01L 27/249 365/51 |
| 2015/0078086 A1* | 3/2015 | Lee | G11C 16/0483 365/185.11 |
| 2016/0232985 A1* | 8/2016 | Sabde | G11C 29/50 |
| 2017/0092371 A1* | 3/2017 | Harari | G11C 16/3431 |
| 2017/0117291 A1* | 4/2017 | Or-Bach | H01L 23/5283 |
| 2017/0256551 A1* | 9/2017 | Lee | H01L 23/5283 |
| 2017/0294383 A1* | 10/2017 | Tanzawa | H01L 27/11582 |
| 2018/0061505 A1 | 3/2018 | Ghai et al. | |
| 2018/0197586 A1* | 7/2018 | Nguyen | G11C 16/08 |
| 2018/0350823 A1* | 12/2018 | Or-Bach | H01L 27/11286 |
| 2019/0043879 A1* | 2/2019 | Lu | H01L 27/11573 |
| 2019/0067314 A1* | 2/2019 | Lu | H01L 27/1157 |

* cited by examiner

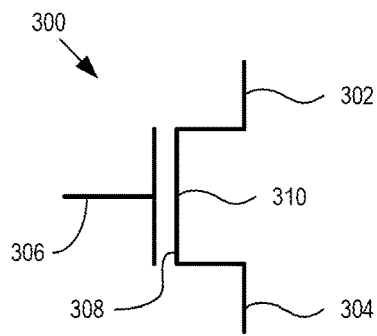
FIG. 3
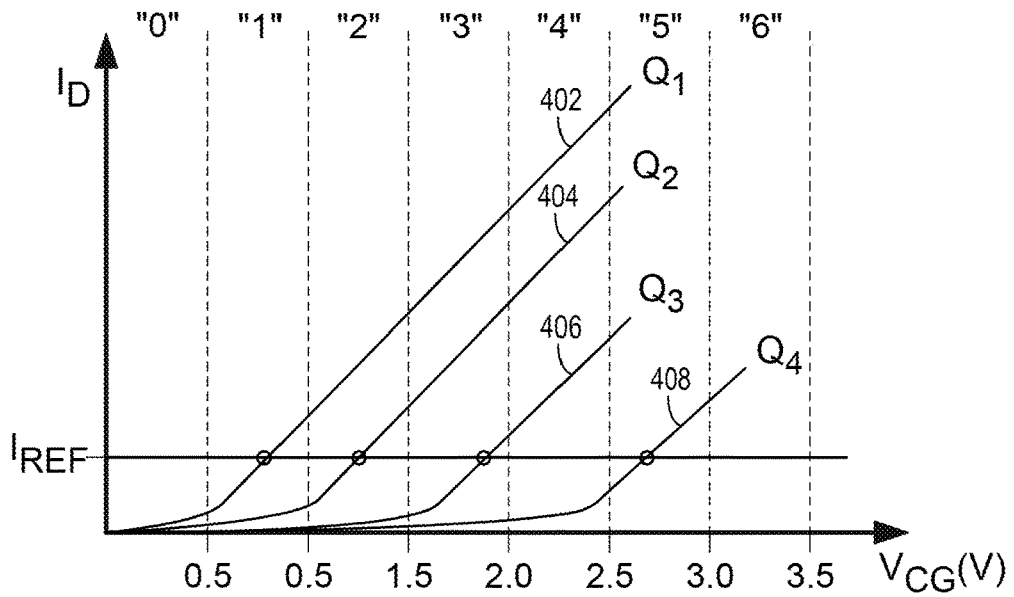
FIG. 4
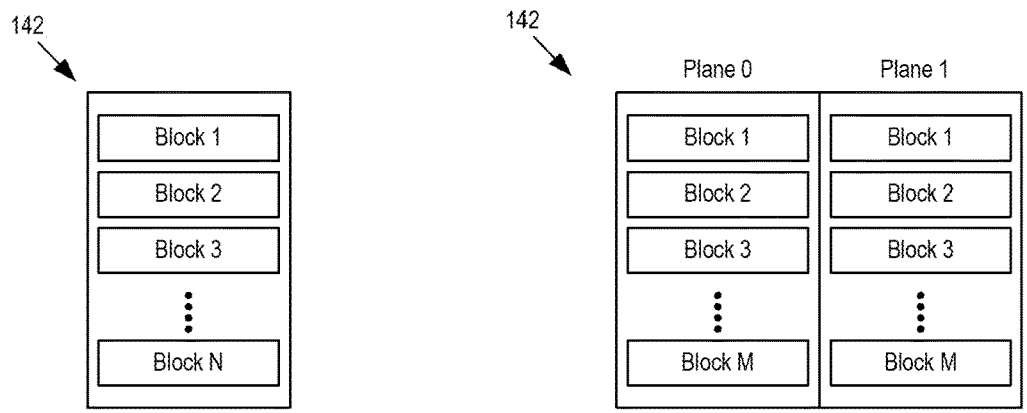
FIG. 5A
FIG. 5B

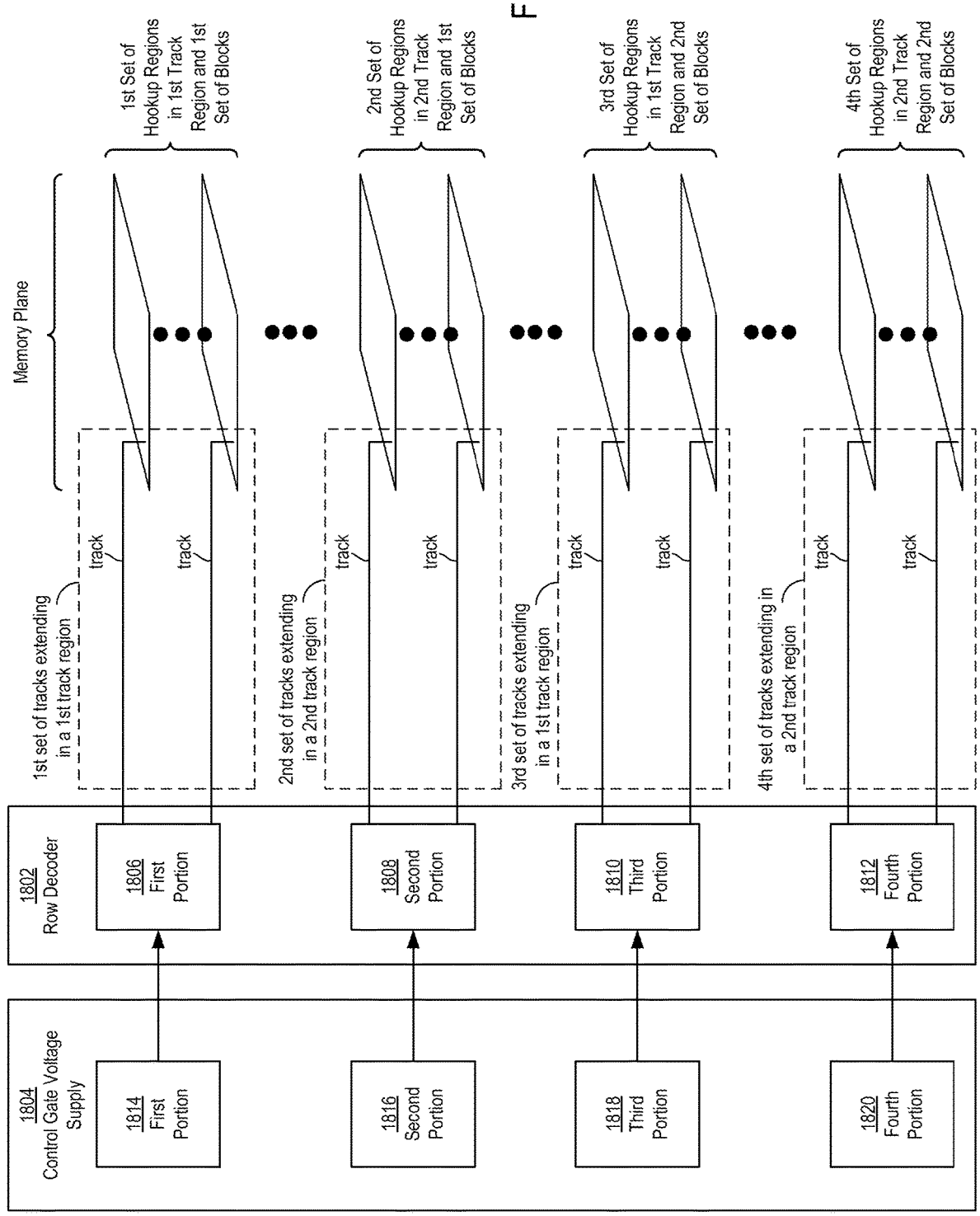

INCREASED TERRACE CONFIGURATION FOR NON-VOLATILE MEMORY

CROSS-REFERENCE TO RELATED APPLICATIONS

This application claims the benefit of U.S. Provisional Application No. 62/560,532, filed Sep. 19, 2017. The contents of U.S. Provisional Application No. 62/560,532 are incorporated by reference in their entirety.

BACKGROUND

Non-volatile memory systems program data into memory cells and read the programmed data from the memory cells by biasing the memory cells with voltages at certain levels during program and read operations. The memory cells may be organized or arranged into arrays, two-dimensionally or three-dimensionally, and connected to bias lines, typically referred to as word lines and bit lines. In some three-dimensional memory arrays, the word lines are configured as planar structures referred to as word line plates.

Voltage generation circuitry configured to generate the voltages used to bias the memory cells is typically located on the same die as the memory cells. Also located on the die is decoder circuitry that selectively routes certain voltages to certain word lines and bit lines so that particular memory cells can be programmed or data can be read from particular memory cells. The decoder circuitry may be separated into a row decoder that routes voltages to word lines and a column decoder that routes voltages to bit lines.

In three-dimensional memory architecture, conductive tracks route voltages from the row decoder to word lines. Increased numbers of word lines may require an increased number of tracks. Due to space constraints, increasing the number of word lines may require reducing the size or pitch of the tracks in order to fit the existing and increased number of tracks in the same amount of area. However, reducing the pitch may be costly and undesirable. Thus, ways to reconfigure the components of a memory die to account for increased numbers of word lines may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 3 is a circuit diagram of an example floating gate transistor.

FIG. 4 is a graph of curves of drain-to-source current as a function of control gate voltage drawn through a floating gate transistor.

FIG. 5A is a block diagram of a plurality of memory cells organized into blocks.

FIG. 5B is a block diagram of a plurality of memory cells organized into blocks in different memory planes.

FIG. 18 is a block diagram of a row decoder and a control gate voltage supply configured to output a plurality of voltages to a plurality of blocks in a memory plane having stacks of control gate layers with two track region configurations.

DETAILED DESCRIPTION

Figure 1A:
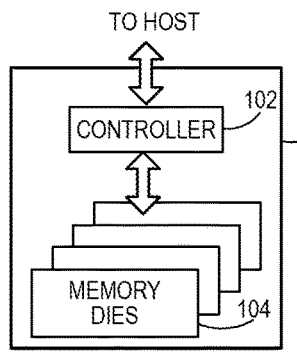
FIG. 1A is a block diagram of an exemplary non-volatile memory system.

The following embodiments describe apparatuses, devices, systems, circuits, and methods for increasing the number of track regions and/or terrace regions per plane and/or per block. In one embodiment, an apparatus includes: a stack including a plurality of control gate layers, a first set of memory cells configured to be biased by the stack of control gate layers, a second set of memory cells configured to be biased by the stack of control gate layers, a track region separating the first set of memory cells from the second set of memory cells, a first set of tracks extending in the track region and configured to bias a first set of control gate layers of the stack of control gate layers, and a second set of tracks extending outside of the track region and configured to bias a second set of control gate layers of the stack of the control gate layers.

In some embodiments, the track region comprises a third set of memory cells is configured to be biased by the stack of control gate layers, and a second track region separates the second set of memory cells from the third set of memory cells.

In some embodiments, the second set of tracks extends through the second track region.

In some embodiments, a row decoder includes a first portion configured to supply a first set of voltages to the first set of tracks, and a second portion configured to supply a second set of voltages to the second set of tracks.

In some embodiments, the first portion and the second portion of the row decoder are in-array components of a same memory cell region in which the second set of memory cells are disposed.

In some embodiments, the first portion and the second portion of the row decoder are in-array components of different memory cell regions.

In some embodiments, the first set of control gate layers includes an upper set of control gate layers of the stack and the second set of control gate layers includes a lower set of control gate layers of the stack.

In another embodiment, an apparatus includes a stack and a row decoder. The stack includes a plurality of control gate layers configured to bias a plurality of memory cells. The row decoder is configured to: output a first set of voltages to a first set of the control gate layers of the stack by way of a first set of tracks extending through a first track region, and output a second set of voltages to a second set of control gate layers of the stack by way of a second set of tracks extending through a second track region.

In some embodiments, the row decoder includes: a first portion configured to output the first set of voltages, and a second portion configured to output the second set of voltages.

In some embodiments, the first portion and the second portion of the row decoder are in-array components of a same memory cell region.

In some embodiments, the first portion and the second portion of the row decoder are in-array components of different memory cell regions.

In some embodiments, the row decoder further includes a third portion configured to output a third set of voltages to a first set of control gate layers of a second stack by way of a third set of tracks extending through the first track region.

In some embodiments, the row decoder further includes a fourth portion configured to output a fourth set of voltages to a second set of control gate layers of the second stack.

In some embodiments, the third portion and the fourth portion of the row decoder are in-array components of different memory cell regions.

In some embodiments, the third portion and the fourth portion of the row decoder are each in-array components of memory cell regions different from the memory cell regions of which the first and second portions are in-array components.

In some embodiments, wherein the first set of control gate layers comprises an upper set of control gate layers of the stack and the second set of control gate layers comprises a lower set of control gate layers of the stack.

In another embodiment, a system includes a memory plane, which includes: a plurality of memory blocks comprising a plurality of hookup regions, a first track region extending across the plurality of memory blocks, and a second track region extending across the plurality of memory blocks, a first set of tracks extending in the first track region and configured to supply a first set of voltages to a first set of hookup regions of the plurality of hookup regions, and a second set of tracks extending in the second track region and configured to supply a second set of voltages to a second set of hookup regions of the plurality of hookup regions.

In some embodiments, a third set of tracks extends in the first track region and is configured to supply a third set of voltages to a third set of hookup regions of the plurality of hookup regions, and a fourth set of tracks extends in the second track region and is configured to supply a fourth set of voltages to a fourth set of hookup regions of the plurality of hookup regions.

In some embodiments, the plurality of blocks includes a first set of blocks and a second set of blocks, where the first set of hookup regions and the second set of hookup regions are both part of the first set of blocks.

In some embodiments, the plurality of blocks includes a first set of blocks and a second set of blocks, and where the first set of hookup regions is part of the first set of blocks and the second set of hookup regions is part of the set of blocks.

In another embodiment, a method includes: outputting, with a first row decoder portion, a first control gate voltage associated with a first memory operation; supplying, with a first track coupled to the first row decoder portion, the first control gate voltage through a first track region to a first control gate layer of a stack; outputting, with a second row decoder portion, a second control gate voltage associated with a second memory operation, and supplying, with a second track coupled to the second row decoder, the second control gate voltage through a second track region to a second control gate layer of the stack.

In some embodiments, an apparatus includes: means for biasing a three-dimensional block of memory cells; means for separating the block of memory cells into a first memory cell region and a second memory cell region, and means for separating the block of memory cells into the second memory cell region and a third memory cell region.

Other embodiments are possible, and each of the embodiments can be used alone or together in combination. Accordingly, various embodiments will now be described with reference to the attached drawings.

The following embodiments describe apparatuses, devices, systems, circuits, and methods for increasing the number of track regions and/or terrace regions per plane and/or per block. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure the it is operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s)s 104, even if a single channel is shown in the drawings.

Figure 1B:
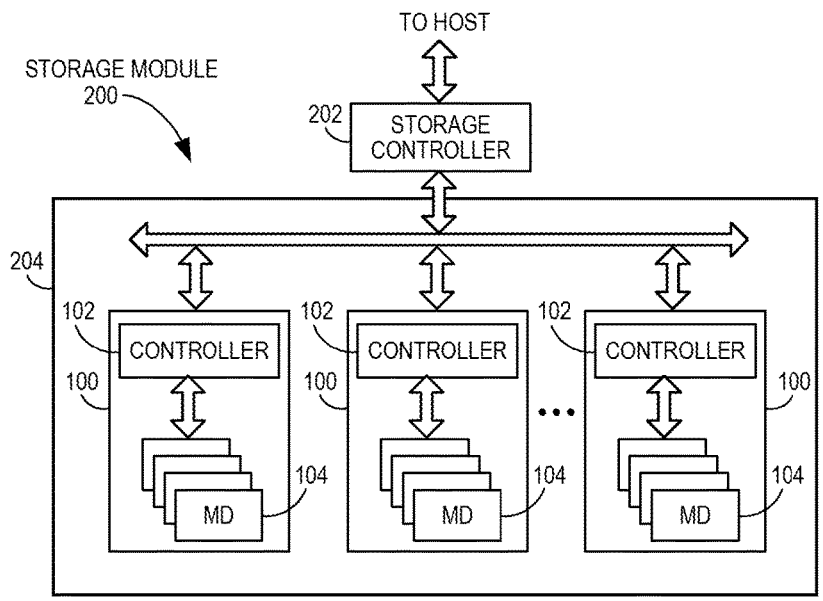
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
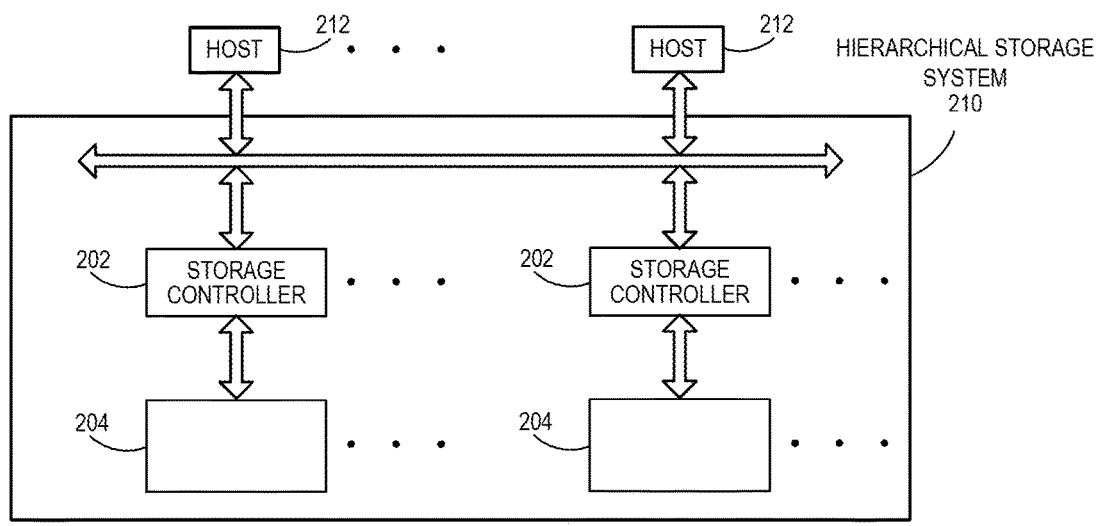
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
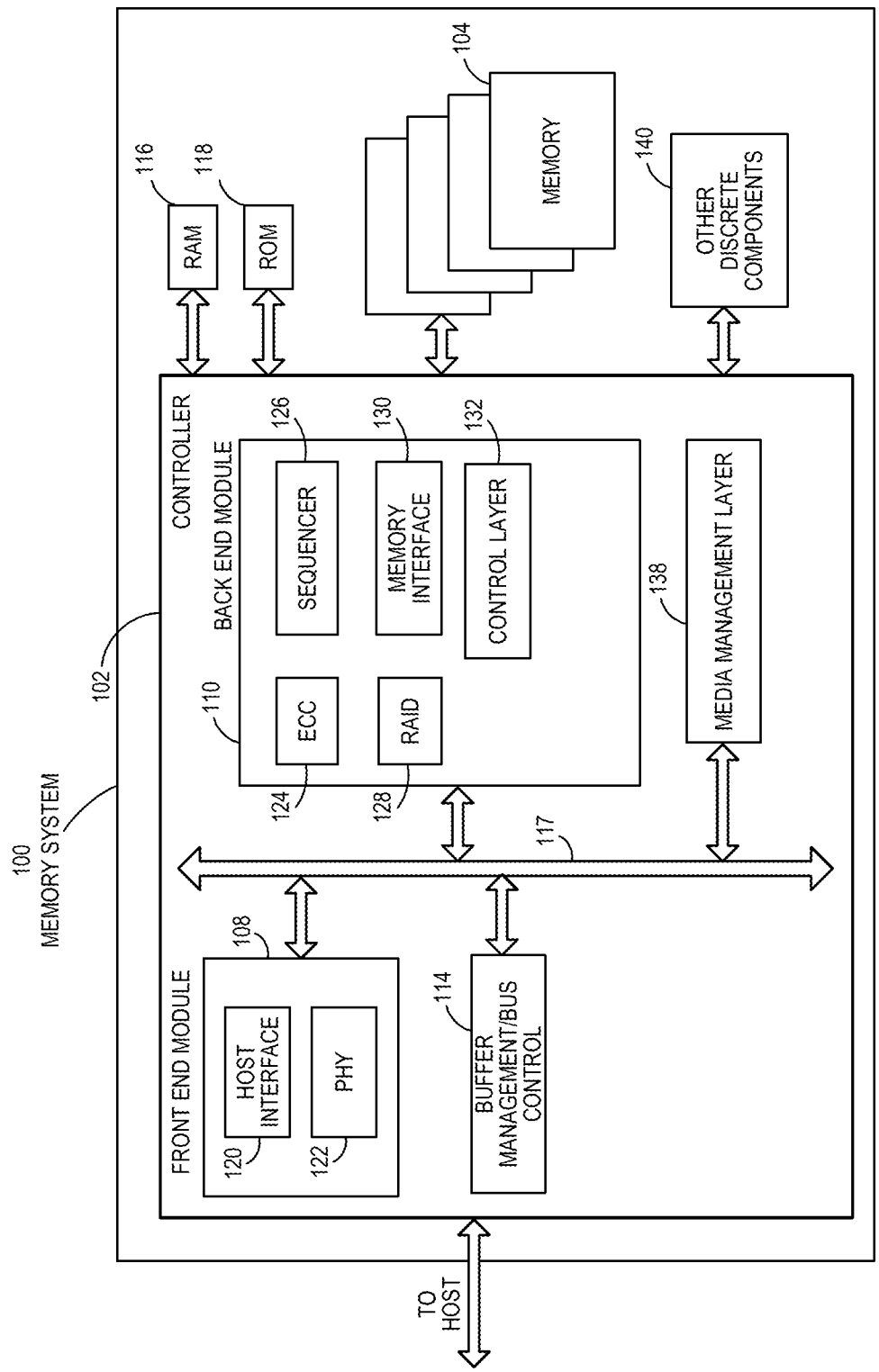
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138, which performs wear leveling of memory cells of the non-volatile memory die 104, address management, and facilitates folding operations as described in further detail below. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
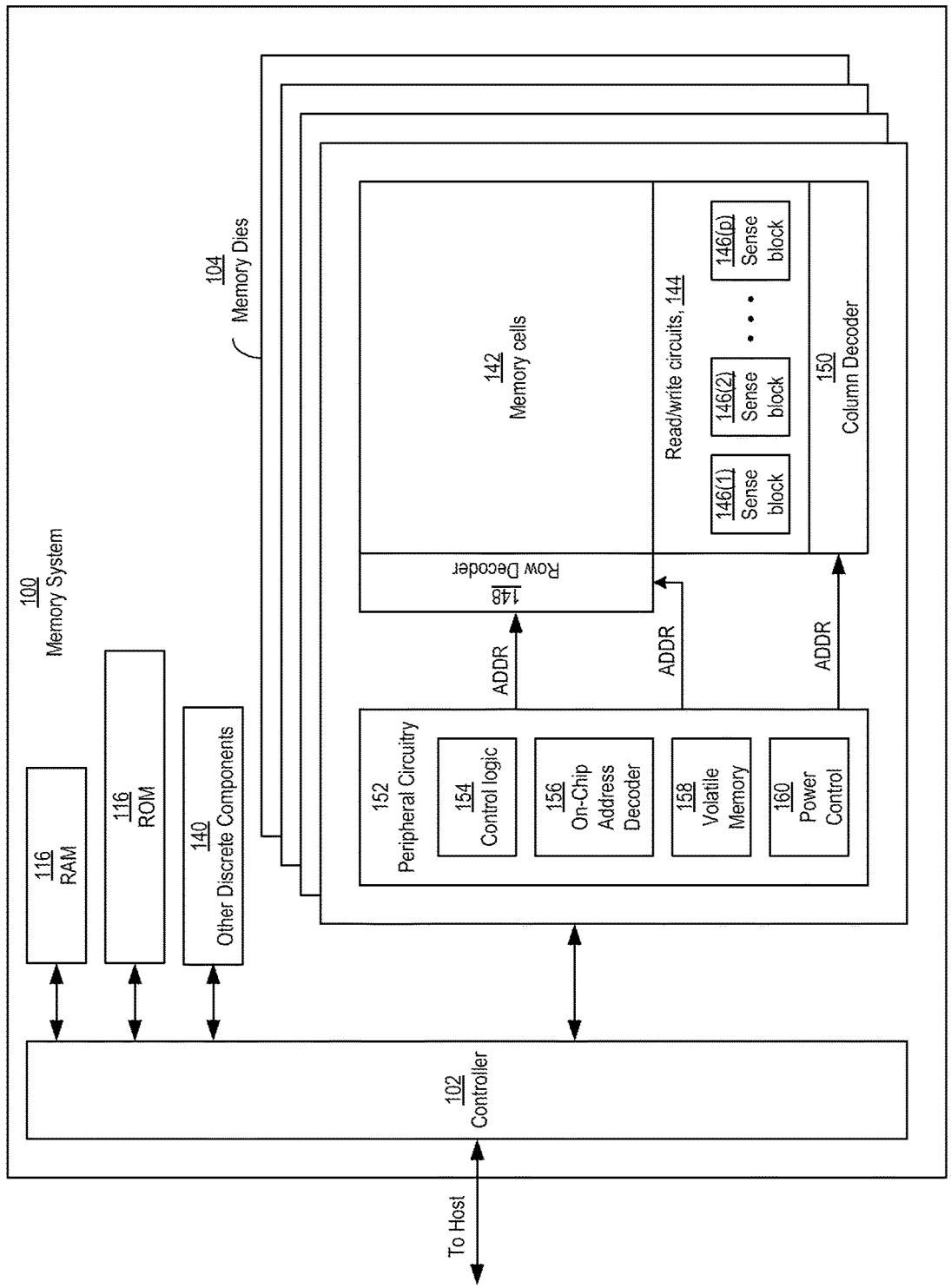
FIG. 2B is a block diagram of exemplary components of a non-volatile memory die of the non-volatile memory system of FIG. 1A.

FIG. 2B is a block diagram illustrating exemplary components of a memory die 104 in more detail. The memory die 104 may include a memory cell structure 142 that includes a plurality of memory cells or memory elements. Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

For some memory configurations, such as flash memory, a memory cell of the plurality of memory cells 142 may be a floating gate transistor (FGT). FIG. 3 shows a circuit schematic diagram of an example FGT 300. The FGT 300 may include a source 302, a drain 304, a control gate 306, a floating gate 308, and a substrate 310. The floating gate 308 may be surrounded by an insulator or insulating material that helps retain charge in the floating gate 308. The presence or absence of charges inside the floating gate 308 may cause a shift in a threshold voltage of the FGT, which is used to distinguish logic levels. For each given charge stored in the floating gate 308, a corresponding drain-to-source conduction current ID with respect to a fixed control gate Voltage $V_{CG}$ applied to the control gate 306 occurs. Additionally, the FGT 300 may have an associated range charges that can be programmable onto its floating gate 308 that define a corresponding threshold voltage window or a corresponding conduction current window. In this way, the FGT's threshold voltage may be indicative of the data stored in the memory cell.

FIG. 4 is graph showing four curves 402, 404, 406, 408 of drain-to-source current ID drawn through the FGT 300 as a function of a control gate voltage $V_{CG}$ applied to the control gate 306. Each curve 402-408 corresponds to a respective one of four different charges or charge levels Q1, Q2, Q3, Q4 that the floating gate 308 can selectively store at any given time. Otherwise stated, the four curves 402-408 represent four possible charge levels that can be programmed on the floating gate 308 of the FGT 300, respectively corresponding to four possible memory states. In the example graph in FIG. 4, the threshold voltage window of a population of FGTs range from 0.5 volts (V) to 3.5 V. Seven possible memory states "0", "1", "2", "3", "4", "5", and "6" are defined or extend across the threshold voltage window, and respectively represent one erased states and six programmed states. The different states can be demarcated by partitioning the threshold voltage window into six regions of 0.5 V intervals. The FGT 300 may be in one of the states according to the charge stored in its floating gate 308 and where its drain-to-source current ID intersects a reference current IREF. For example, a FGT programmed to store charge Q1 in memory state "1" since its curve 402 intersects the reference current IREF in a region of the threshold voltage region demarcated by the control gate voltage $V_{CG}$ in a range from 0.5 V to 1.0 V. The more memory states the FGT 300 is programmed to store, the more finely divided are the regions defining the threshold voltage window. In some examples configurations, the threshold voltage window may extend from −1.5 V to 5 V, providing a maximum width of 6.5 V. If the FGT 300 can be programmed into any one of sixteen possible states, each state may occupy a respective region spanning 200 millivolts (mV) to 300 mV. The higher the resolution of the threshold voltage window (i.e., more states into which the FGT 300 can be programmed), the higher the precision that is needed in programming and reading operations to successfully read and write data. Further description of memory states and threshold voltages is provided in further detail below with respect to programming, program verify, and read operations.

Referring to FIG. 5A, the memory cells 142 located on a single memory die 104 may be organized into an N-number of blocks, extending from a first block Block 1 to an Nth block Block N. Herein, a block is a minimum unit of erase of a memory die 104. Memory cells that are part of the same block are erased at the same time and/or as part of a same erase operation. Referring to FIG. 5B, for some example configurations, the N-number of blocks are organized into a plurality of memory planes (or just planes). FIG. 5B shows an example configuration where the blocks are organized into two memory planes, including a first memory plane Plane 0 and a second memory plane Plane 1. Configurations that include more than two memory planes may be possible.

In FIG. 5B, each memory plane is shown as including an M-number of blocks, extending from a first block Block 1 to an Mth block Block M. In at least some example configurations, blocks that are part of the same plane may be oriented in and/or form a column or a one-dimensional array of blocks, although other configurations of blocks in a single plane may be possible.

On a single memory die 104, circuitry configured to perform memory operations may perform simultaneously or in parallel multiple data operations associated with memory blocks located in different planes. For example, on a single memory die 104, the circuitry can simultaneously program a first data set into or sense the first data set from a first block located in a first plane on the memory die 104, while at the same time program a second data set into or sense the second data set from a second block located in a second plane on the memory die 104. However, the circuitry does not perform simultaneously or in parallel multiple data operations associated with memory blocks located in the same plane. For example, the circuitry is configured to sequentially or otherwise at different times program a first data set into or sense the first data set from a first block located in a first plane on the memory die 104 and program a second data set into or sense the second data set from a second block located in the same first plane on the memory die 104.

Additionally, for configurations where the memory cells are organized into a two-dimensional array, the memory cells may be configured in a matrix-like structure of rows and columns in each of the blocks. At the intersection of a row and a column is a memory cell. A column of memory cells is a referred to as a string, and memory cells in a string are electrically connected in series. A row of memory cells is referred to as a page. Where the memory cells are FGTs, control gates of FGTs in a page or row may be electrically connected together.

Additionally, each of the blocks includes word lines and bit lines connected to the memory cells. Each page of memory cells is coupled to a word line. Where the memory cells are FGTs, each word line may be coupled to the control gates of the FGTs in a page. In addition, each string of memory cells is coupled to a bit line. Further, a single string may span across multiple word lines, and the number of memory cells in a string may be equal to the number of pages in a block.

Figure 6:
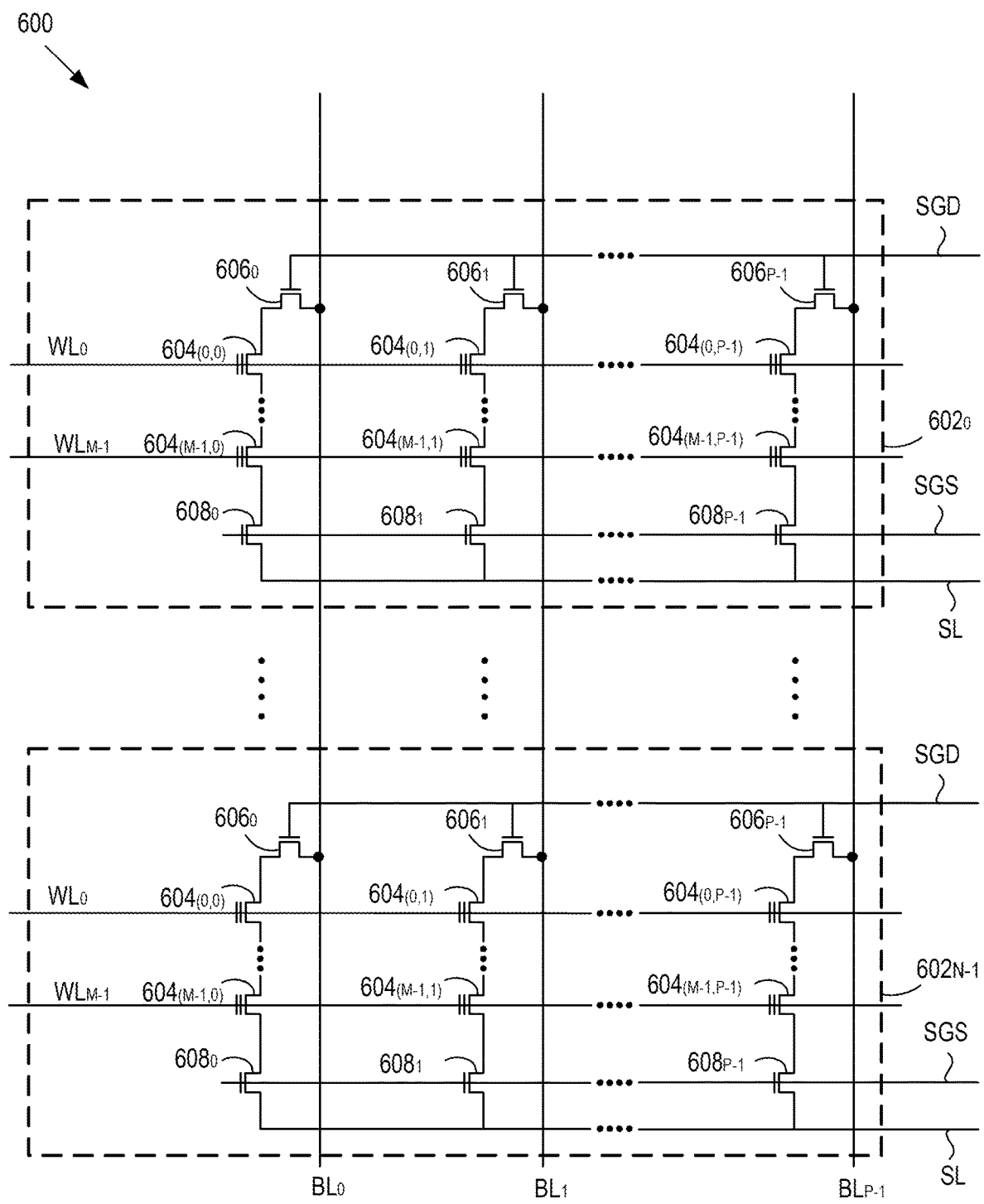
FIG. 6 is a circuit diagram of an example two-dimensional NAND-type flash memory array.

FIG. 6 is a circuit schematic diagram of at least a portion of an exemplary two-dimensional NAND-type flash memory array 600, which may be representative of at least a portion of the plurality of memory cells 142. For example, the memory array 600 may be representative of a single memory plane of blocks on a memory die 104. The memory array 600 may include an N-number of blocks $602_0$ to $602_{N-1}$. Each block 602 includes a P-number of strings of FGTs 604, with each string coupled to respective one of a P-number of bit lines $BL_0$ to $BL_{P-1}$. Additionally, each block 602 includes an M-number of pages of FGTs 604, with each page coupled to a respective one of an M-number of word lines $WL_0$ to $WL_{M-1}$. Each ith, jth FGT(i,j) of a given block 602 is connected to an ith word line $WL_i$ and to a jth bit line $BL_j$ of the given block. As shown in FIG. 6, bit lines $BL_0$ to $BL_{P-1}$ are shared among the blocks $602_0$ to $602_{N-1}$ may be which are shared among the blocks, such as blocks within the same plane.

Within each block 602, each string is connected at one end to an associated drain select gate transistor 606, and each string is coupled to its associated bit line BL via the associated drain select gate transistor 606. Switching of the drain select gate transistors $606_0$ to $606_{P-1}$ may be controlled using a drain select gate bias line SGD that supplies a drain select gate bias voltage $V_{SGD}$ to turn on and off the drain select transistors $606_0$ to $606_{P-1}$. In addition, within each block 602, each string is connected at its other end to an associated source select gate transistor 608, and each string is coupled to a common source line SL via the associated source select gate transistor 608. Switching of the source select gate transistors $608_0$ to $608_{P-1}$ may be controlled using a source select gate bias line SGS that supplies a source select gate bias voltage $V_{SGS}$ to turn on and off the source select transistors $608_0$ to $608_{P-1}$. Also, although not shown, in some cases, dummy word lines, which contain no user data, can also be used in the memory array 600 adjacent to the source select gate transistors $608_0$ to $608_{P-1}$. The dummy word lines may be used to shield edge word lines and FGTs from certain edge effects.

An alternative arrangement to a conventional two-dimensional (2-D) NAND memory array is a three-dimensional (3-D) memory array. In contrast to 2-D memory arrays, which are formed along a planar surface of a semiconductor wafer, three-dimensional memory arrays extend up from the wafer surface. A 3-D memory array may include stacks, or columns, of memory cells extending upwards from the wafer surface. Various 3-D memory array configurations are possible. As previously described with reference to FIG. 5B, a 3-D memory array of memory cells on a single memory die 104, like a 2-D array of memory cells, may have its memory cells arranged into a plurality of blocks, and, in turn, those blocks are arranged into one or more memory planes.

Figure 7A:
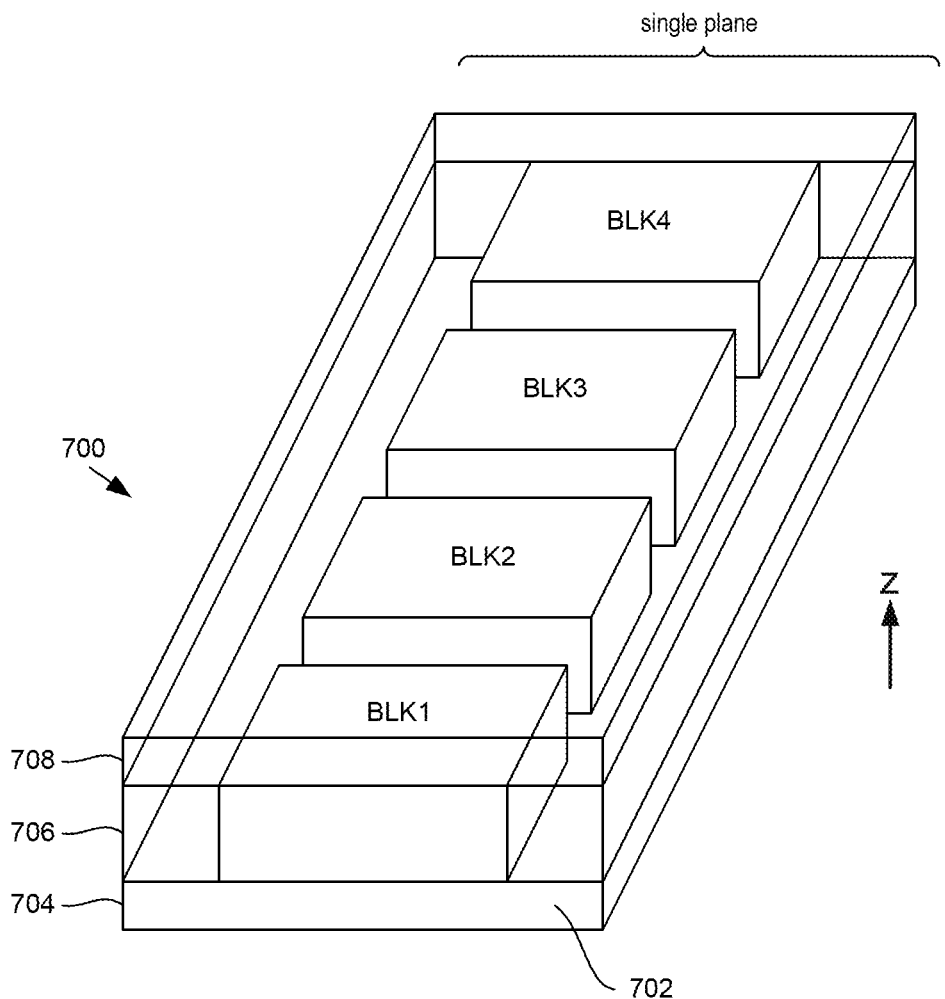
FIG. 7A is a perspective view of at least a portion of a memory die of FIG. 7B that includes a plurality of three-dimensional blocks.

FIG. 7A shows a perspective view of at least a portion of a memory die 104 that includes a set or a plurality of blocks 700 of the memory array 142 of FIG. 2B, with the blocks 700 having a three-dimensional configuration. In the example configuration, the blocks 700 are oriented in a single or a same memory plane. Other example configurations may orient the blocks 700 into a plurality planes, such as in two planes in accordance with the two-plane configuration shown in FIG. 5B. For simplicity, the plurality of blocks 700 is shown as including four blocks, BLK1, BLK2, BLK3, and BLK4, oriented or arranged in the single plane. In actual implementation, one plane may include several more than four blocks, such as on the order of hundreds, thousands, or tens of thousands of blocks. In a particular example configuration, one plane includes 2,000 blocks.

The blocks 700 are located or disposed on a substrate 702 of the memory die 104. As described in further detail below, the substrate 702 may be part of a lower level or region 704 of the memory die 104, and may carry circuitry under the blocks, along with one or more lower metal layers patterned to form conductive paths that carry or supply signals or voltages output from the circuitry, such as those used to perform memory operations (read, program, erase, e.g.). The blocks 700 are disposed in an intermediate level or region 706 (also referred to as a block level or region, or an array level or region) of the memory die 104 in between the lower region 704 and an upper level or region 708 of the memory die 104. The upper region 706 may include one or more upper metal layers patterned in the form of conductive paths that carry or supply signals or voltages output from the circuitry.

The substrate 702 is generally a planar structure having opposing planar surfaces. Herein, the components on the die can be physically described with reference to a three-dimensional Cartesian coordinate system having an x-axis, a y-axis, and a z-axis. The z-axis is the axis of the three that extends perpendicular to the planar surfaces of the substrate 702. In general, the components on a memory die 104 are disposed and/or extend from one of the planar surfaces in a z-direction parallel with the z-axis. The terms "above" and "below" as well as other terms such as "top" and "bottom" and "upper" and "lower" are used herein to describe relative positioning of components of the die along or with reference to the z-axis. For example, the blocks 700 are "above" the substrate 702, and the substrate 702 is part of the lower region 704 that is "below" the blocks 700. In addition, the upper region 708 is a region of the memory die 104 "above" both the blocks 700 and the substrate 702. Components of the memory die 104 disposed in the upper region 708 are farther away in the z-direction from the substrate 702 than components of the blocks 700. In general, for two components on a given memory die 104, where the first component is "above" the second component, the first component is positioned or disposed farther in the z-direction from the substrate 702 than the second component. In addition, where the first component is "below" the second component, the first component is positioned or disposed closer in the z-direction to the substrate 702 than the second component.

The terms "top" and "bottom" are also used to refer to components relative positioning in the z-direction and/or along the z-axis. In general, "bottom" components are positioned or disposed closer in the z-direction to the substrate 702 than "top" components, and "top" components are positioned or disposed farther in the z-direction from the substrate 702 than "bottom" components. In one example, as described in further detail below, a memory die 104 includes one or more top metal layers disposed in the upper region 708 and one or more bottom metal layers disposed in the lower region 704. In general, the bottom metal layers are positioned or disposed closer in the z-direction to the substrate 702 than the top metal layers, and the top metal layers are positioned or disposed farther in the z-direction from the substrate 702 than the bottom metal layers.

Although the terms "upper" and "lower," "above" and "below," and "upper" and "lower," are used to describe the relative position of components on a memory die 104, they should not be construed as limiting the relative positioning of the components since a memory die 104, or the memory system 100 as a whole, can be oriented in any of various positions.

As described in further detail below, a block of a three-dimensional memory array may include a stack of alternating layers of control gate layers and dielectric layers. The block may further include a plurality of memory cells three-dimensionally arranged and configured to be biased by the control gate layers. Accordingly, as used herein, a stack is a collection of control gate layers and dielectric layers in which a block of memory cells are disposed. The control gate layers and the dielectric layers of a stack are alternatingly arranged one on top of another. The alternating control gate and dielectric layers of a stack are generally planar structures that, stacked on top of one another, extend in the z-direction away from the substrate 702, and that laterally or horizontally extend in an x-direction and a y-direction, each perpendicular to the z-direction.

Figure 7B:
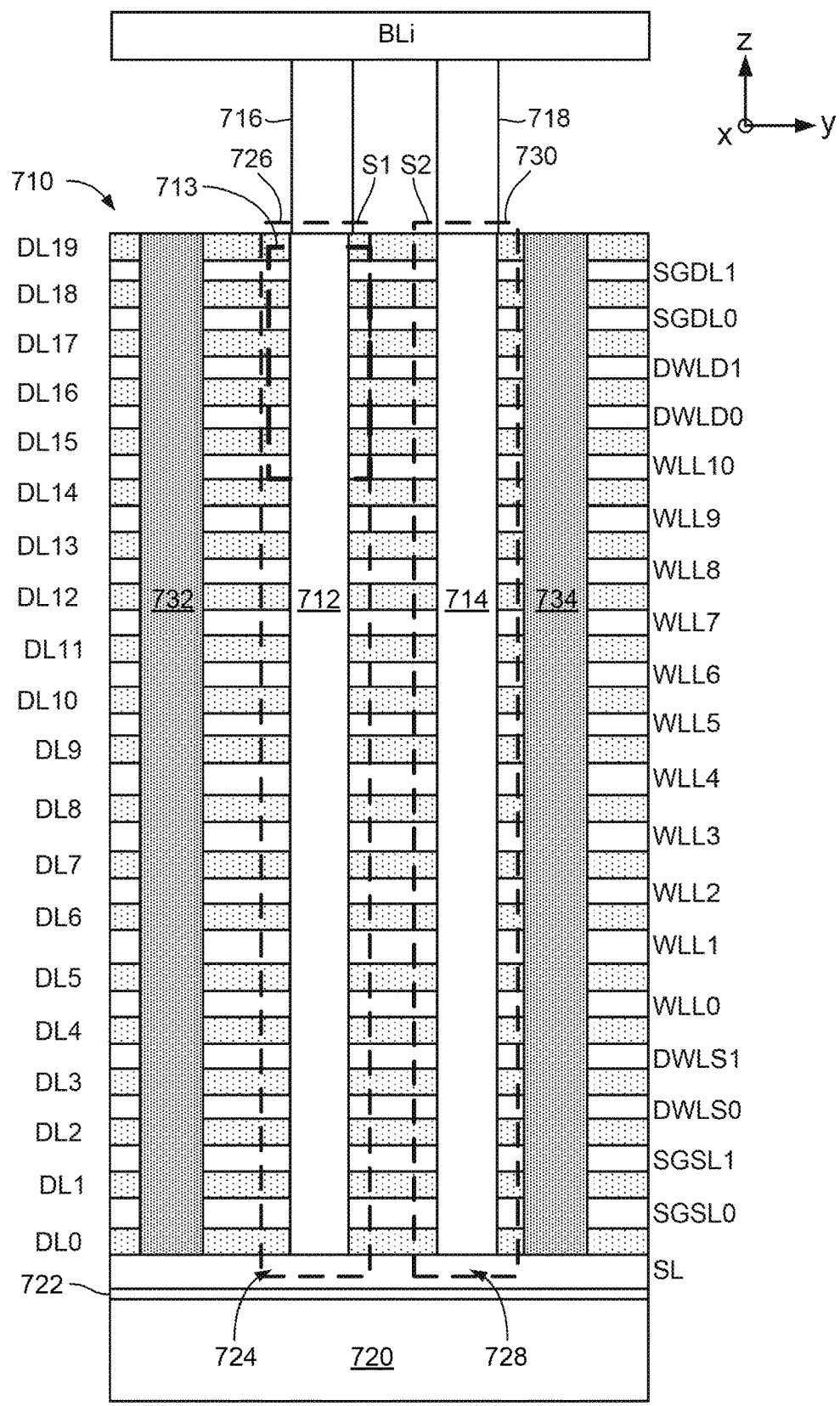
FIG. 7B is a cross-sectional view of a portion of one of the blocks of FIG. 7A.

FIG. 7B shows a cross-sectional view of a portion of one of the blocks of FIG. 7A. The block includes a stack 710 of alternating conductive and dielectric layers. The conductive layers are alternatively referred to as conductive sheets or conductive plates. The stack 710 also includes a plurality of memory cell strings. The cross-sectional view of FIG. 7B shows two of the memory cell strings, including a first memory cell string S1 and a second memory cell string S2. For NAND memory technology, the memory cell strings may be referred to as NAND strings.

Each memory cell string includes or encompasses a memory cell hole (or just memory hole). For example, the first memory cell string S1 includes a first memory hole 712 and the second memory cell string S2 includes a second memory hole 714. Each memory hole is filled with materials that form memory cells adjacent to the conductive layers. A region 713 of the stack 710 is shown and described in greater detail with respect to FIG. 7C. In addition, each memory cell string may be electrically connected to a bit line of the block by way of an associated conductive via. In FIG. 7A, each of the first and second strings S1, S2 are electrically connected to an ith bit line $BL_i$, with the first string S1 electrically connected to the ith bit line BLi by way of a first conductive via 716, and the second string S2 electrically connected to the ith bit line BLi by way of a second conductive via 718.

The stack 710 may further include a substrate 720, an insulating film 722 on the substrate 720, and a source line SL. Each of the strings may include opposing ends, including a source end and a drain end. The source end is connected to the source line SL, and the drain end is connected to its associated conductive via. In FIG. 7B, the first string S1 includes a source end 724 connected to the source line SL, and a drain end 726 connected to the first conductive via 716. Similarly, the second string S2 includes a source end 728 connected to the source line SL, and a drain end 730 connected to the second conductive via 718.

In some example configurations, the stack 710 may further include vertical interconnects (e.g., metal-filled slits) extending through the stack 710. For example, the configuration in FIG. 7B shows two interconnects 732, 734 extending through the conductive and dielectric layers of the stack 710. The interconnects may connect the source line SL to a conductive line above the stack 710.

Additionally, for each of the strings, the memory cells of a given string may be formed in different levels in vertical alignment with different conductive layers of the stack 710. In NAND memory technology, for each of the NAND strings, each of the conductive layers is electrically connected to a respective one of the transistors of a given string, and is configured to bias a control gate of the respective transistor with a supplied voltage. Accordingly, the conductive layers are referred to as control gate layers (or alternatively control gate sheets or control gate plates). In FIG. 7B, each of the control gate layers is referred to and labeled corresponding to the transistors of the NAND strings to which the control gate layer is electrically connected. In the example configuration of FIG. 7B, each of the strings includes two source select gate transistors, two source-side dummy memory cells, eleven memory cells, eleven memory cells; two drain-side memory cells, and two drain select gate transistors. Accordingly, in the example configuration of FIG. 7B, the control gate layers includes a first source select gate bias layer SGSL0 connected to and configured to bias control gates of first source select gate transistors of the NAND strings; a second source select gate bias layer SGSL1 connected to and configured to bias control gates of second source select gate transistors of the NAND strings; a first source-side dummy word line layer DWLS0 connected to and configured to bias control gates of first source-side dummy memory cells of the NAND strings; a second source-side dummy word line layer DWLS1 connected to and configured to bias control gates of second source-side dummy memory cells of the NAND strings; eleven word line layers WLL0 to WLL10 connected to and configured to bias respective first through eleventh control gates of memory cells of the NAND strings; a first drain-side dummy word line layer DWLD0 connected to and configured to bias control gates of first drain-side dummy memory cells of the NAND strings; a second drain-side word line layer DWLD1 connected to and configured to bias control gates of second drain-side dummy memory cells of the NAND strings; a first drain select gate bias layer SGDL0 connected to and configured to bias control gates of first drain select gate bias transistors of the NAND strings; and a second drain select gate bias layer SGDL1 connected to and configured to bias control gates of second drain select gate bias transistors of the NAND strings. In addition, as shown in FIG. 7B, the plurality of dielectric layers (DL) includes twenty dielectric layers DL0 to DL20 disposed in between the control gate layers.

The numbers of transistors used for the select gate transistors, the dummy memory cells, and the memory cells shown in FIG. 7B are merely exemplary, and other numbers for any or each of the select gate transistors, the dummy memory cells, and the memory cells may be possible. The number of dielectric layers may also be different, corresponding to different numbers of control gate layers.

Figure 7C:
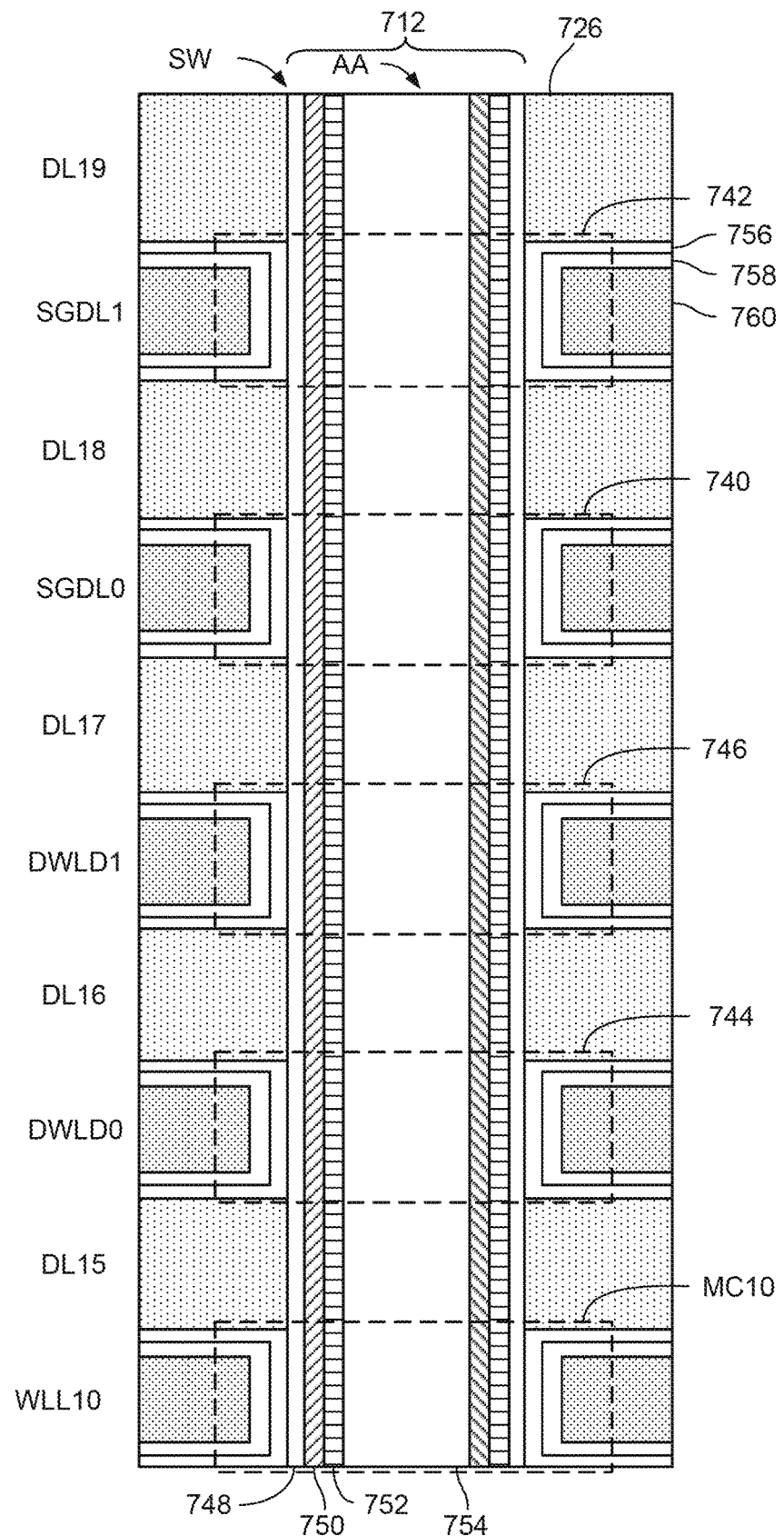
FIG. 7C is a close-up view of the cross-section of FIG. 7B.

FIG. 7C is a close-up view of the region 713 of the stack 710 of FIG. 7B. The components of a memory cell string (e.g, the transistors of a NAND string), are formed at the different levels of the stack 710 at the intersection of respective control gate layers and a memory hole. The example configuration depicted in the close-up view of FIG. 7C, a first drain select gate transistor 740 and a second drain select gate transistor 742 are disposed above first and second drain-side dummy memory cells 744, 746, and eleventh memory cell MC10 (e.g., the first and second drain select gate transistors 740, 442 are disposed between the second drain-side dummy memory cell 746 and the drain end 726.

A number of layers of material can be deposited along a sidewall (SW) of the memory hole 712 and/or within each control gate layer, such as by using atomic layer deposition as an example. In some example configurations, such as the one shown in FIG. 7C, the layers of materials within the memory hole 712 (which may be referred to as a column or a pillar of materials) may include a charge-trapping layer or film 748 such as silicon nitride, a tunneling layer 750, a polysilicon body or channel 752, and a dielectric core 754. In addition, in some example configurations, such as the one shown in FIG. 7C, the materials making up the transistors of the NAND string may include may include a blocking oxide/block high-k material 756, a barrier metal 758, and a conductive metal 760 (e.g. Tungsten) that forms the control gates of the transistors. The materials forming the transistors of the strings may be disposed in the same level or in the same plane as the respective control gate layers. Other configurations may use materials the deposited along the sidewall (SW) or for the transistors other than those shown and described with reference to FIG. 7C.

Figure 7D:
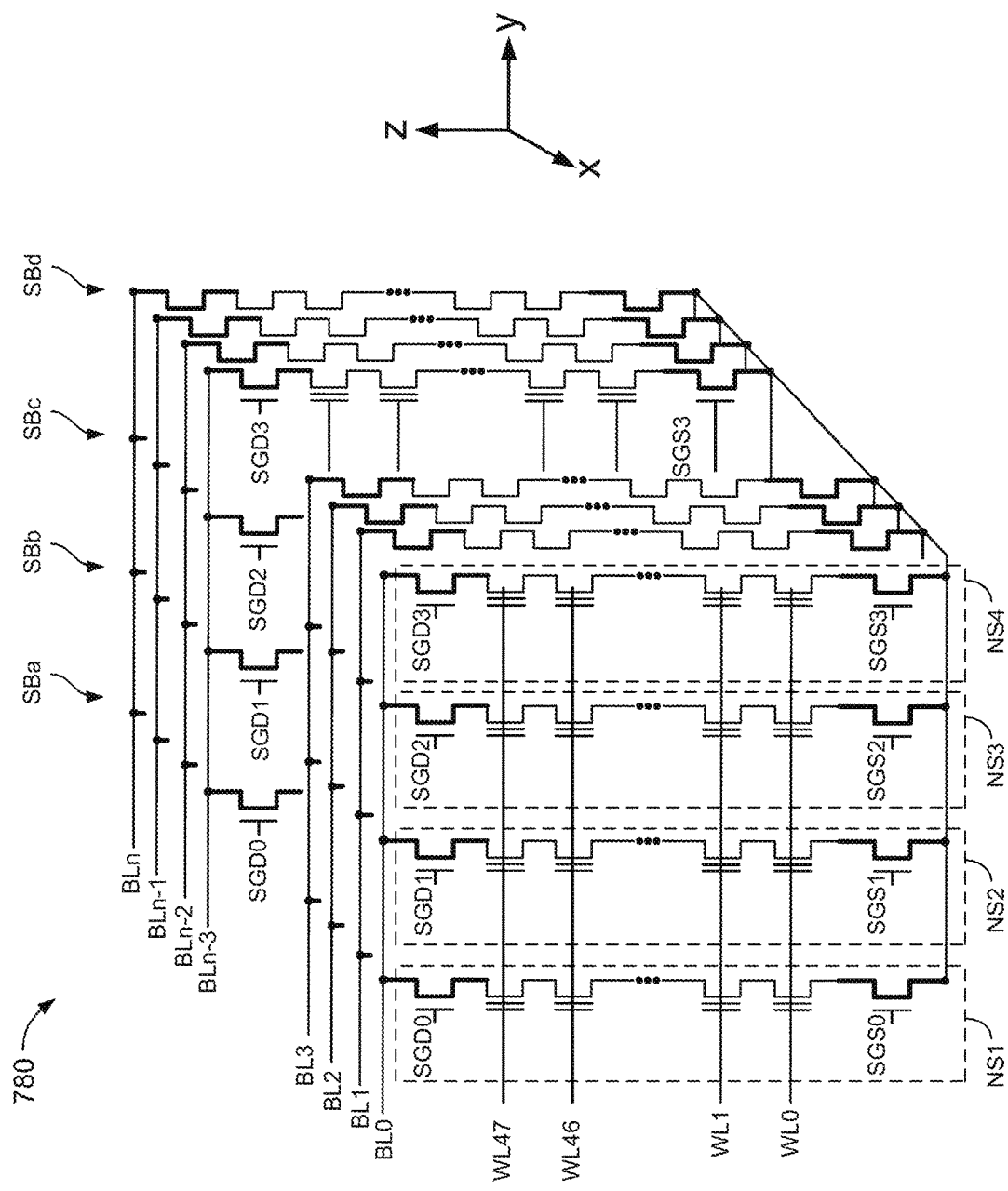
FIG. 7D is a circuit schematic diagram of a block of memory cells three-dimensionally arranged into a plurality of NAND strings.

FIG. 7D shows a circuit schematic diagram of a block 780 of memory cells three-dimensionally arranged into a plurality of NAND strings. The block 780 may represent at least a portion of one of the blocks BLK1, BLK2, BLK3, BLK4 of FIG. 7A and/or have the physical construction or structure as depicted in FIGS. 7B, 7C.

In the example configuration of FIG. 7D, each NAND string includes 48 memory cells coupled to 48 word lines. Numbers other than 48 are possible for other configurations. Also, herein, the terms "word lines" and "word line layers" are used interchangeably. In addition, the NAND strings are coupled to an (n+1)-number of bit lines BL0 to BLn. The NAND strings may be arranged into a plurality of string groups, with each string group coupled to a respective one of the bit lines BL at their drain ends. To illustrate, FIG. 7D includes a string group of four NAND strings NS1, NS2, NS3, NS4, each having its drain end coupled to a first bit line BL0.

Other or additional ways of grouping the NAND strings of the block 780 may be possible. For example, in some example configurations, NAND strings extending across the bit lines BL may grouped together to form sub-blocks SB. NAND strings that are part of the same sub-block may have their source select gate transistors coupled to a same or common source select gate bias line SGS, and their drain select gate transistors coupled to a same or common drain select gate bias line SGD. For example, the block 780 is shown as including four sub-blocks, including a first sub-block SBa, a second sub-block SBb, a third sub-block SBc, and a fourth sub-block SBd. NAND strings extending from the first bit line BL0 to the (n+1)th bit line BLn in the first sub-block SBa may have control gates of respective source select gate transistors connected to a same source select gate bias line SGS0, and control gates of respective drain select gate transistors connected to a same drain select gate bias line SGD0. NAND strings in the second, third, and fourth sub-blocks SBb, SBc, SBd may similarly have control gates of their source and drain select gate transistors coupled to the same source and drain select gate bias lines SGS1, SGD1, SGS2, SGD2, SGS3, SGD3, respectively. Various ways of grouping or arranging the NAND strings into groups, sets, or sub-blocks may be possible, and the various conductive layers may be formed in accordance with the way the NAND strings are grouped or arranged.

Referring back to FIG. 2B, the memory die 104 may further include read/write circuits 144 that includes a plurality or p-number of sense blocks (also referred to as sense modules or sense circuits) 146. As described in further detail below, the sense blocks 146 are configured to participate in reading or programming a page of memory cells in parallel.

The memory die 104 may also include a row address decoder 148 and a column address decoder 150. The row address decoder 148 may decode a row address and select a particular word line in the memory array 142 when reading or writing data to/from the memory cells 142. The column address decoder 150 may decode a column address to select a particular group of bit lines in the memory array 142 to read/write circuits 144.

In addition, the non-volatile memory die 104 may include peripheral circuitry 152. The peripheral circuitry 152 may include control logic circuitry 154, which may be implemented as a state machine, that is configured to control on-chip memory operations as well as send status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158. An example configuration of the volatile memory 158 may include latches, although other configurations are possible.

In addition, the peripheral circuitry 152 may include power control circuitry 160 that is configured to generate and supply voltages to the memory array 142, including voltages (including voltage pulses) to the word lines and the bit lines, source select gate bias voltage to the source select gate bias lines, drain select gate bias voltages to the drain select gate bias lines, a cell source voltage $V_{celsrc}$ on the source lines SL, as well as other voltages that may be supplied to the memory array 142, the read/write circuits 144, including the sense blocks 146, and/or other circuit components on the memory die 104. The power control circuitry 160 may include any of various circuit topologies or configurations to supply the voltages at appropriate levels to perform the read, write, and erase operations, such as driver circuits, current sources, charge pumps, reference voltage generators, regulators, and pulse generation circuits, or a combination thereof. Other types of circuits to generate the voltages may be possible. In addition, the power control circuitry 160 may communicate with and/or be controlled by the control logic circuitry 154, the read/write circuits 144, and/or the sense blocks 146 in order to supply the voltages at appropriate levels and at appropriate times to carry out the memory operations.

For NAND technology, in order to program a target memory cell, and in particular a FGT, the power control circuitry 160 applies a program voltage to the control gate of the memory cell, and the bit line that is connected to the target memory cell is grounded, which in turn causes electrons from the channel to be injected into the floating gate. During a program operation, the bit line that is connected to the target memory cell is referred to as a selected bit line. Conversely, a bit line that is not connected to a target memory cell during a program operation is referred to as an unselected bit line. In this context, a state of the bit line may refer to whether the bit line is selected or unselected. Otherwise stated, a bit line can be in one of two states, selected or unselected. When electrons accumulate in the floating gate, the floating gate becomes negatively charged and the threshold voltage $V_{TH}$ of the memory cell is raised. The power control circuitry 160 applies the program voltage $V_{PGM}$ on the wordline that is connected to the target memory cell in order for the control gate of the target memory cell to receive the program voltage $V_{PGM}$ and for the memory cell to be programmed. As previously described, in a block, one memory cell in each of the NAND strings share the same word line. During a program operation, the word line that is connected to a target memory cell is referred to as a selected word line. Conversely, a word line that is not connected to a target memory cell during a program operation is referred to as an unselected word line.

Figure 8A:
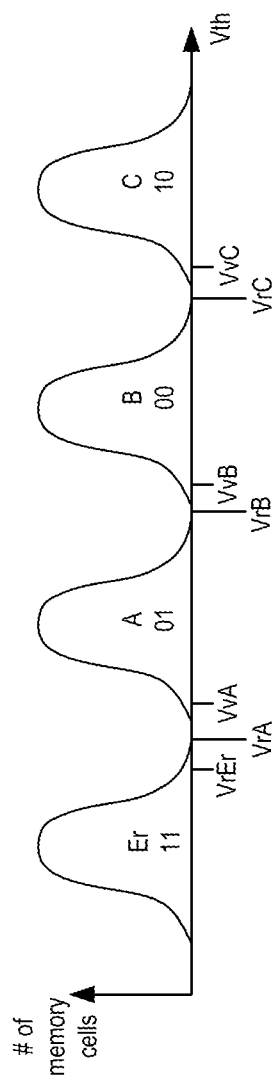
FIG. 8A is a plot of threshold voltage distribution curves for memory cells storing two bits of data.
Figure 8B:
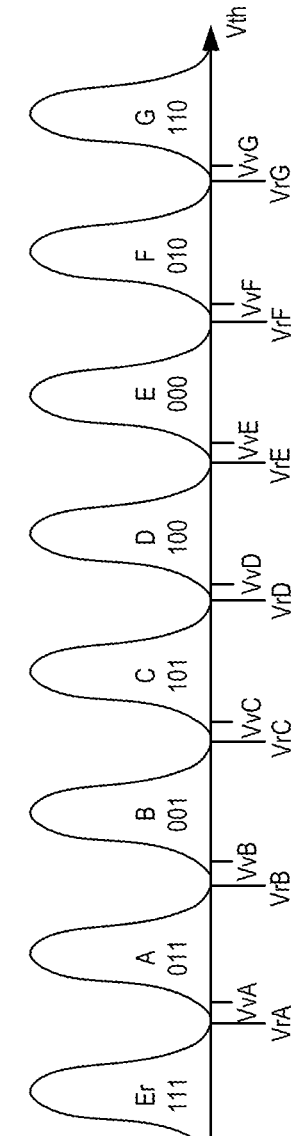
FIG. 8B is a plot of threshold voltage distribution curves for memory cells storing three bits of data.
Figure 8C:
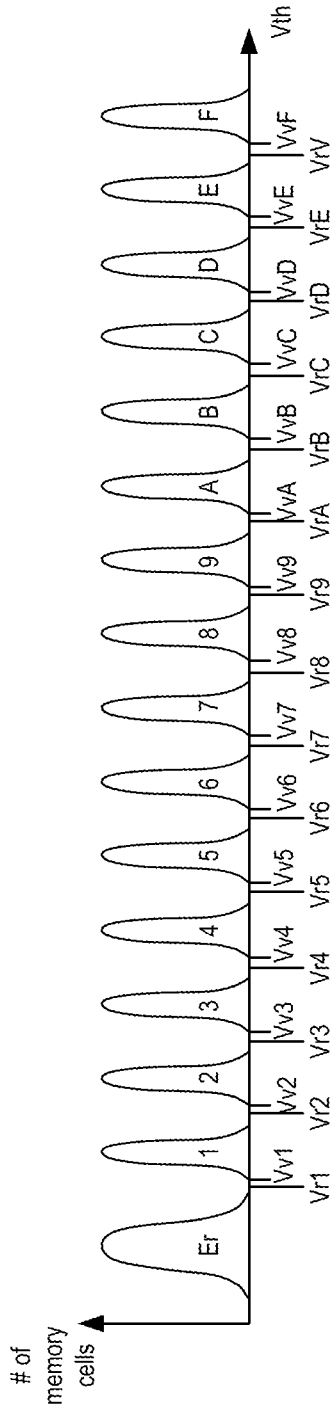
FIG. 8C is a plot of threshold voltage distribution curves for memory cells storing four bits of data.

FIGS. 8A-8C are plots of threshold voltage distribution curves for different numbers of bits being stored the memory cells. The threshold voltage distribution curves are plotted for threshold voltage $V_{TH}$ as a function of the number of memory cells. FIG. 8A show threshold voltage distribution curves for memory cells programmed to store two bits of data, FIG. 8B show threshold voltage distribution curves for memory cells programmed to store three bits of data, and FIG. 8C show voltage distribution curves for memory cells programmed to store four bits of data. Similar threshold voltage distribution curves may be generated for memory cells programmed to store numbers of bits other than, such as more than, two, three, or four.

At a given point in time, each memory cell may be a particular one of a plurality of memory states (otherwise referred to as a data state). The memory states may include an erased stated and a plurality of programmed states. Accordingly, at a given point in time, each memory cell may be in the erased state or one of the plurality of programmed states. The number of programmed states corresponds to the number of bits the memory cells are programmed to store. With reference to FIG. 8A, for a memory cell programmed to store two bits, the memory cell may be in an erased state Er or one of three programmed states A, B, C. With reference to FIG. 8B, for a memory cell programmed to store three bits, the memory cell may be in an erased state Er or one of seven programmed states A, B, C, D, E, F, G. With reference to FIG. 8C, for a memory cell programmed to store four bits, the memory cell may be in an erased state Er or one of fifteen programmed states 1, 2, 3, 4, 5, 6, 7, 8, 9, A, B, C, D, E, F. As shown in FIGS. 8A-8C, each voltage distribution curve is associated with the erased state or one of the programmed states.

Additionally, each threshold voltage distribution curve defines and/or is associated with a distinct threshold voltage range that, in turn, defines, is assigned, or is associated with a distinct one of a plurality of predetermined n-bit binary values. As such, determining what threshold voltage $V_{TH}$ a memory cell has allows the data (i.e., the logic values of the bits) that the memory cell is storing to be determined. The specific relationship between the data programmed into the memory cells and the threshold voltage levels of the memory cell depends on the data encoding scheme used for programming the memory cells. In one example, as shown in FIGS. 8A and 8B, a Gray code scheme is used to assign data values to the threshold voltage distribution curves. Under this scheme, for memory cells programmed with two bits of data, the data value "11" is assigned to the range of threshold voltages associated with the erased state Er, the data value "01" is assigned to the range of threshold voltages associated with programmed state A, the data value "00" is assigned to the range of threshold voltages associated with programmed state B, and the data value "10" is assigned to the range of threshold voltages associated with the programmed state C. Similar relationships between data values and memory states can be made for memory cells programmed to store three bits, four bits, or other bits of data.

Prior to performance of a program operation that programs a plurality or group of target memory cells, all of the memory cells of the group subjected to and/or selected to be programmed in the programming operation may be in the erased state. During the programming operation, the power control circuitry 160 may apply the program voltage to a selected word line and in turn the control gates of the target memory cells as a series of program voltage pulses. The target memory cells being programmed concurrently are connected to the same, selected word line. In many programming operations, the power control circuitry 160 increases the magnitude of the program pulses with each successive pulse by a predetermined step size. Also, as described in further detail below, the power control circuitry 160 may apply one or more verify pulses to the control gate of the target memory cell in between program pulses as part of a program loop or a program-verify operation. Additionally, during a programming operation, the power control circuitry 160 may apply one or more boosting voltages to the unselected word lines.

The target memory cells connected to the selected word line will concurrently have their threshold voltage change, unless they have been locked out from programming. When the programming operation is complete for one of the target memory cells, the target memory cell is locked out from further programming while the programming operation continues for the other target memory cells in subsequent program loops. Also, for some example programming operations, the control logic circuitry 154 may maintain a counter that counts the program pulses.

During a program operation to program a group of target memory cells, each target memory cell is assigned to one of the plurality of memory states according to write data that is to be programmed into the target memory cells during the program operation. Based on its assigned memory state, a given target memory cell will either remain the erased state or be programmed to a programmed state different from the erased state. When the control logic 154 receives a program command from the controller 102, or otherwise determines to perform a program operation, the write data in stored in latches included in the read/write circuitry 144. During the programming operation, the read/write circuitry 144 can read the write data to determine the respective memory state to which each of the target memory cells is to be programmed.

As described in further detail below, and as illustrated in FIGS. 8A-8C, each programmed state is associated with a respective verify voltage level $V_V$. A given target memory cell is programmed in its assigned memory state when its threshold voltage $V_{TH}$ is above the verify voltage $V_V$ associated with the memory state assigned to that target memory cell. As long as the threshold voltage $V_{TH}$ of the given target memory cell is below the associated verify voltage $V_V$, the control gate of the target memory cell may be subject to a program pulse to increase the target memory cell's threshold voltage $V_{TH}$ to within the threshold voltage range associated with the memory state assigned to the given target memory cell. Alternatively, when the threshold voltage $V_{TH}$ of the given target memory cell increases to above the associated verify voltage level $V_V$, then programming may be complete for the given target memory cell. As described in further detail below, a sense block 146 may participate in a program-verify operation that determines whether programming for a given memory cell is complete.

As previously mentioned, target memory cells subject to a program operation may also be subject to a verify operation that determines when programming is complete for each of the target memory cells. The verify operation is done in between program pulses, and so the programming operation and the verify operation in performed in an alternating or looped manner. The combination of the programming operation and the verify operation is called a program-verify operation. Accordingly, a program-verify operation includes a plurality of programming operations and a plurality of verify operations that are alternatingly performed. That is, a program-verify operation involves a programming operation followed by a verify operation, followed by another programming operation, followed by another verify operation, and so on until the program-verify operation has no more programming or verify operations to be performed. In addition, a single programming operation of a program-verify operation includes the power control circuitry 160 supplying one or more program pulses to the selected word line for that single programming operation, and a single verify operation of a program-verify operation includes the power control circuitry 160 supplying one or more verify pulses to the selected word line for that single programming operation. Accordingly, a program-verify operation may include the power control circuitry 160 supplying a pulse train or a series of voltage pulses to the selected word line, where the pulse train includes one or more program pulses followed by one or more verify pulses, followed by one or more program pulses, followed by one or more verify pulses, and so on until the program-verify process has no more program or verify pulses for the power control circuitry 160 supply to the selected word line.

A program-verify operation is complete when the verify portion of the program-verify operation identifies that all of the memory cells have been programmed to their assigned threshold voltages $V_{TH}$. As mentioned, the verify process verifies or determines that a given target memory cell is finished being programmed when the verify process determines that the target memory cell's threshold voltage has increased to above the verify voltage level $V_V$ associated with the memory state to which the target cell is to be programmed.

For some example program-verify operations, all of the target memory cells subject to a program-verify operation are not subject to a single verify operation at the same time. Alternatively, for a single verify operation, only those target memory cells that are assigned to the same memory state are subject to a verify operation. For a single verify operation, target memory cells that are subject to the single verify operation are called selected memory cells or selected target memory cells, and target memory cells that are not subject to the single verify operation are called unselected memory cells or unselected target memory cells. Likewise, for a group of bit lines connected to the target memory cells of a program-verify operation, bit lines connected to the selected memory cells for a single verify operation are called selected bit lines, and bit lines connected to the unselected memory cells for a single verify operation are called unselected bit lines. In this context, a state of the bit line may refer to whether the bit line is selected or unselected. Otherwise stated, a bit line can be in one of two states, selected or unselected.

For each of the verify operations, the power control circuitry 160, or some combination of the power control circuitry 160, the read/write circuitry 144, and the sense blocks 146, may supply voltages at appropriate levels to the selected and unselected word lines and the selected and unselected bit lines in order for a verify operation to be performed for the selected memory cells of the target memory cells subject to the program-verify operation. For clarity, and unless otherwise specified, the combination of the power control circuitry 160, the read/write circuitry 144, and the sense blocks 146 used to bias the selected and unselected word lines and bit lines at appropriate levels during a given memory operation (e.g., a programming operation, a verify operation, a program-verify operation, a read operation, or an erase operation) is herein referred to collectively as voltage supply circuitry. Voltage supply circuitry may refer to the power control circuitry 160, the sense block circuitry 146, other circuit components of the read/write circuitry 144, or any combination thereof.

For performance of a verify operation in a block, the voltage supply circuitry may supply a drain select gate bias voltage $V_{SGD}$ on the drain select gate bias line SGD to the control gates of the drain select gate transistors (e.g., transistors 606 of FIG. 6) and a source select gate bias voltage $V_{SGS}$ on the source select gate bias line SGS to the control gates of the drain select gate transistors (e.g., transistors 608 of FIG. 6) at levels that turn on the drain select gate transistors and the source select gate transistors in response to the voltage supply circuitry supplying voltages at suitable levels on the common source line SL and to the bit lines.

Additionally, the voltage supply circuitry supplies a source line voltage at a cell source voltage level Vcelsrc, otherwise referred to as the cell source voltage Vcelsrc, on the common source line SL. Further, the voltage supply circuitry biases the drain side of the selected bit lines with a high supply voltage VHSA that is higher in magnitude than the cell source voltage Vcelsrc. The difference between the high supply voltage VHSA and the cell source voltage level Vcelsrc may be great enough to allow current to flow from the drain side to the source side of a string that includes a selected target memory cell in the event that the selected target memory cell has a threshold voltage $V_{TH}$ that allows it to conduct a current. During a verify operation, a selected memory cell can be generally characterized as fully conducting, marginally conducting, or non-conducting, depending on the threshold voltage $V_{TH}$ of the selected memory cell. Also, the voltage supply circuitry biases the drain side of the unselected bit lines to the cell source voltage Vcelsrc. By biasing the drain side and the source side of unselected bit lines to the cell source voltage Vcelsrc, the voltage difference between the drain side and source side voltages will not allow current to flow through the NAND string connected to the unselected bit line. Further, the voltage supply circuitry biases the unselected word lines, and in turn the control gates of FGTs coupled to the unselected word lines, to a read voltage Vread. The read voltage is high enough to cause the FGTs coupled to unselected word lines to conduct a current regardless of its threshold voltage $V_{TH}$. In addition, the voltage supply circuitry biases the selected word line with a control gate reference voltage $V_{CGRV}$, which may be in the form of one or more verify pulses as previously described. The control gate reference voltage $V_{CGRV}$ may be different for verification of target memory cells of different memory states. For example, the voltage supply circuitry may supply a different control gate reference voltage $V_{CGRV}$ (or a control gate reference voltage $V_{CGRV}$ at different level) when verifying target memory cells programmed to state A than when verifying target memory cells programmed to state B, and so on.

Once the voltage supply circuitry supplies the voltages to the selected and unselected word lines and bit lines, and to the drain select gate transistors, source select gate transistors, drain select gate bias line SGD, and source select gate bias line SGS, a sense block can perform a sense operation that identifies whether a selected target memory cell is conducting, and in turn sufficiently programmed. Further details of the sense operation portion of the verify operation are described in further detail below.

As previously described, the threshold voltage $V_{TH}$ of a memory cell may identify the data value of the data it is storing. For a given read operation in a block, a memory cell from which data is to be read is referred to as a selected memory cell, and a memory cell from which data is not to be read is referred to as an unselected memory cell. So, when data is to be read from a page of memory cells for a particular read operation, those memory cells in the page are the selected memory cells, and the memory cells of the block that are not part of the page are the unselected memory cells. Additionally, a word line connected to the page of selected memory cells is referred to as the selected word line, and the other word lines of the block are referred to as the unselected word lines.

During a read operation to read data stored in target memory cells of a page, the sense blocks 146 may be configured to perform a sense operation that senses whether current is flowing through the bit lines connected to the target memory cells of the page. The voltage supply circuitry may supply voltages on the selected and unselected word lines at appropriate levels that cause current to flow or not to flow based on the threshold voltage $V_{TH}$ of the target memory cells. For some configurations, the level of the voltage supplied to the selected word lines may vary depending on the states of the memory cells.

The voltage supply circuitry may also bias the bit lines so that the high supply voltage VHSA is applied to the drain side of the bit lines and the cell source voltage Vcelsrc is applied to the source side of the bit lines to allow for the current flow, provided that the threshold voltage $V_{TH}$ of the selected memory cell allows for it. For some example read configurations, where the sense block 146 can perform a sense operation for fewer than all of the memory cells of a page. For such configurations, the target memory cells of the page that are subject to and/or that are selected for a given sense operation are referred to as selected memory cells or selected target memory cells. Conversely, the target memory cells of the page that are not subject to and/or that are not selected for the sense operation are referred to as unselected memory cells. Accordingly, bit lines connected to selected target memory cells are referred to as selected bit lines, and bit lines connected to unselected target memory cells are referred to as unselected bit lines. In this context, a state of the bit line may refer to whether the bit line is selected or unselected. Otherwise stated, a bit line can be in one of two states, selected or unselected. The voltage supply circuitry can supply the voltages to the selected and unselected word lines and the selected and unselected bit lines at levels in various combinations and/or in various sequences and/or over various sense operations in order determine the threshold voltages of the target memory cells so that the data values of the data that the target memory cells are storing can be determined.

Figure 9:
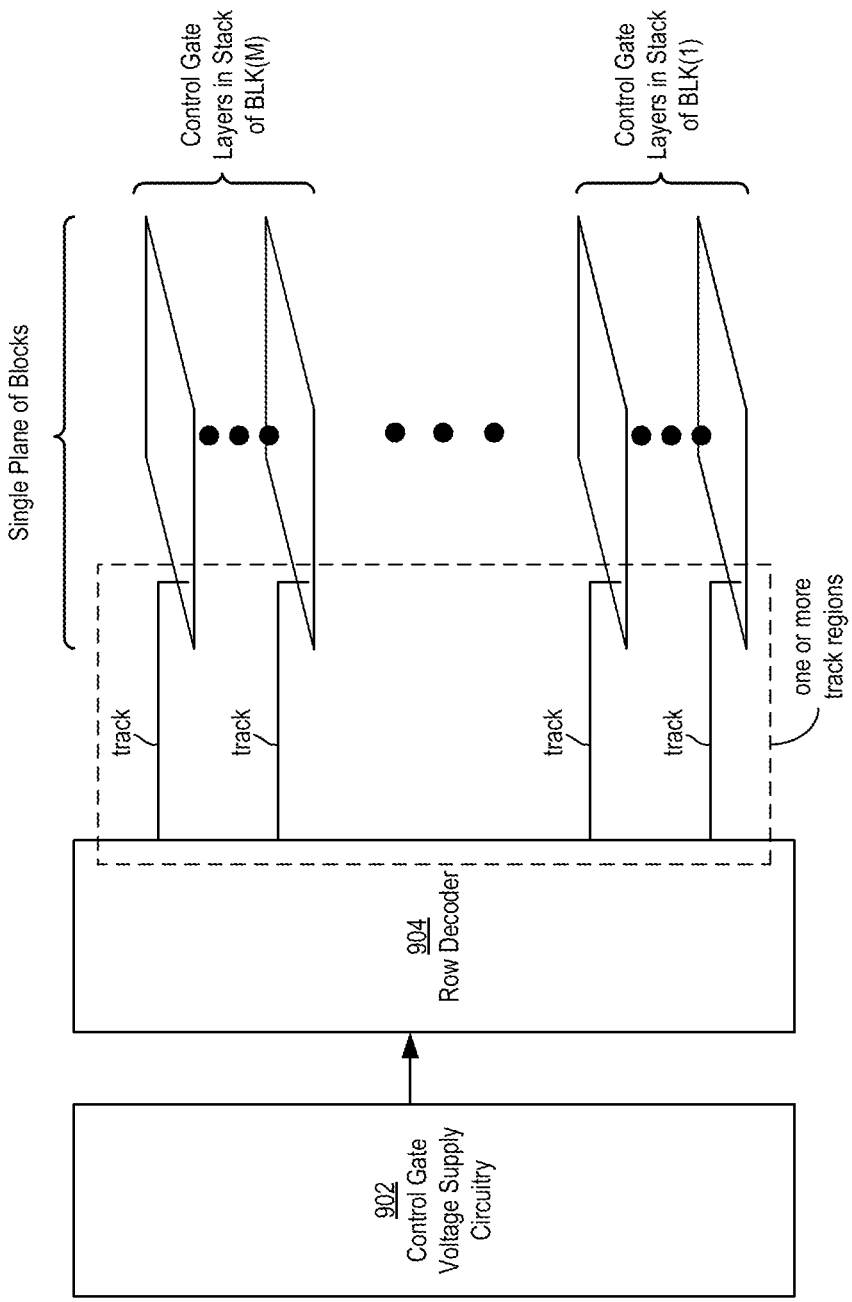
FIG. 9 is a block diagram of circuit components of a memory die used to bias control gate layers of a three-dimensional blocks arranged in a single memory plane.

FIG. 9 shows a block diagram of circuit components of a memory die 104 used to bias control gate layers of three-dimensional blocks arranged in a single memory plane. As previously described with reference to FIGS. 7A-7C, a three-dimensional block may include a stack of control gate layers, including drain and source select gate layers, word line layers, and dummy word line layers. FIG. 9 shows control gate layers of an M-number of blocks BLK(1) to BLK(M) disposed in a single or a same plane. In order to perform memory operations (read, program, erase, e.g.) on memory cells coupled to the word line layers of the blocks BLK, control gate voltage supply circuitry 902 generates and outputs voltages (including voltage pulses) at certain times and at certain levels, and the row decoder 904 selectively routes the voltages to particular control gate layers to particular blocks BLK in the plane to carry out the memory operations.

The control gate voltage supply circuitry 902 may represent at least a portion of the power control circuitry 160, (generally the voltage supply circuitry), and the rower decoder 904 may represent at least a portion of the row decoder 148, as previously described with reference to FIG. 2B. The row decoder 904 may include a plurality of control gate switches (e.g., transistors) that turn on and off to selectively route the voltages received from the control gate voltage supply circuitry 902 to the control gate layers of the blocks BLK. The control gate switches of the row decoder 904 may have any of various configurations, such as single-tier or multi-tier (or tree) configurations. For a given memory operation, a given overall state of the control gate switches configured in on and off states determines who the voltages received from the control gate voltage supply circuitry 902 is routed to the control gate layers of the blocks. The control circuitry 154 (FIG. 2B) may be configured to output an address control signal ADDR (which may include a single signal or a plurality of signals) corresponding to an address (e.g., a word line address) of a selected word line to the row decoder 904. In response, the control gate switches of the row decoder 904 are configured in on and off states corresponding to the address control signal ADDR in order to route the voltages received from the control gate voltage supply circuitry 902 for biasing the control gate layers to carry out the memory operations.

The row decoder 904 is configured to output, route, supply, or send voltages to the control gate layers and/or bias the control gate layers with the voltages it is outputting by way of tracks. A track is a conductive path that extends from an output of the row decoder 904 to an associated control gate layer of one of the blocks BLK in the memory plane, and supplies a voltage output from the row decoder to the associated control gate layer. A track may include any component or combination of components suitable to transmit a signal or voltage on, or in, an integrated circuit, non-limiting examples of which include traces, vertical interconnects (vias), wire bonds, bond pads, or solder bumps. However, a track is not necessarily limited to only components used for integrated circuits, and may additionally, or alternatively, include other types of transmission lines that can carry or communicate signals or voltages, including coaxial cables, striplines, waveguides, or optical fibers as non-limiting examples.

The tracks electrically connecting the row decoder 904 to the control gate layers may physically extend in one or more track regions. A track region is a two-dimensional or three-dimensional area or region through or over which at least one track extends. Boundaries of a track region may be defined on a per-block basis or on a per-plane basis. Boundaries defining a track region on a per-block basis define a track region for those tracks that connect to control gate layers of a particular block. Boundaries defining a track region on a per-plane basis define a track region for those tracks that connect to control gate layers of blocks of a particular memory plane. As described in further detail below, a single block having a stack of control gate layers connected by a set of tracks may include or otherwise be associated with two or more track regions defined on a per-block basis through which the set of tracks extend. In addition, a single memory plane of a plurality of blocks, each having a stack of control gate layers connected to one of a plurality of sets of tracks, may include or otherwise be associated with two or more track regions defined on a per-plane basis through which the plurality of sets of tracks extend.

A track region for at least one track of a particular block may include at least one of the control gate layers of the particular block. That is, the least one track for which the track region is defined extends directly above and/or below (such as laterally or horizontally above and/or below in an x-direction, a y-direction, or in a direction otherwise perpendicular to the z-direction) the at least one control gate layer, and/or extends through (such as vertically through in a z-direction) the at least one control gate layer. Similarly, a track region for at least some tracks of blocks of a particular plane may include at least some of the control gate layers of the blocks of the particular plane. That is, the tracks for which the track region is defined extends directly above and/or below (such as laterally or horizontally above and/or below in an x-direction, a y-direction, or in a direction otherwise perpendicular to the z-direction) the control gate layers of the blocks of the plane, and/or extends through (such as vertically through in a z-direction) the control gate layers of the blocks of the plane.

Figure 10:
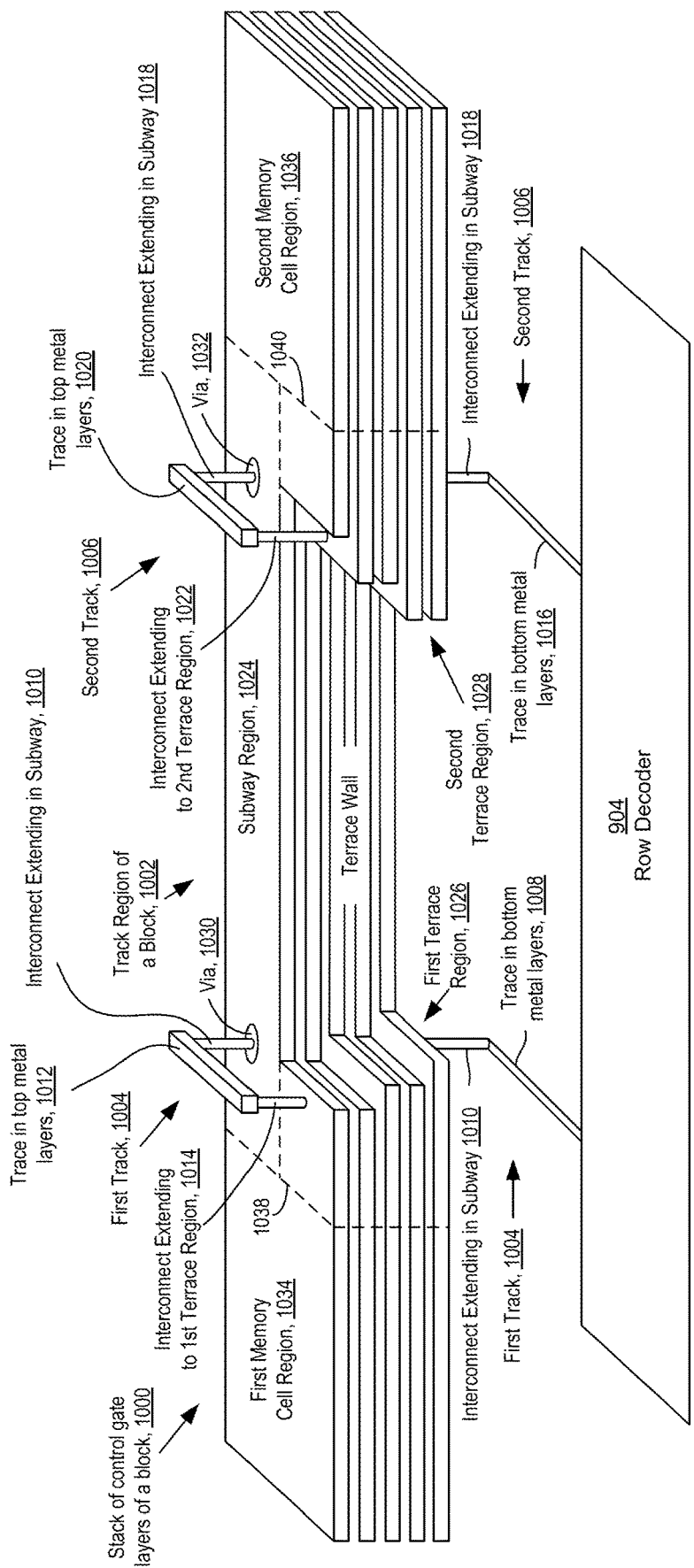
FIG. 10 is a perspective view of an example stack of control gate layers that forms part of a single track region.

FIG. 10 is a perspective view of an example configuration of a stack 1000 of control gate layers of a three-dimensional block, where a track region 1002 associated with the block includes a portion of the control gate layers. For simplicity, the stack 1000 is shown as including five control gate layers, although actual numbers of control gate layers may be greater than 100. In addition, for simplicity, FIG. 10 shows only two tracks extending in the track region 1002, including a first track 1004 and a second track 1006, although in actual implementation, the number of tracks is much greater than two. As described in further detail below, the number of tracks extending in a track region may be proportionate to the number of control gates and the number of track regions. For a configuration that includes only one track region for a block, the number of tracks extending in the track region is equal to the number of control gate layers to be biased. As described in further detail below, the number of tracks extending in a track region may be reduced, on a per-block basis and/or on a per-plane basis, by increasing the number of track regions per block or per plane.

As previously described, the tracks supply the voltages output from the row decoder 904 to the control gate layers. In some example three-dimensional configurations, such as shown in FIG. 10, the row decoder 904 is disposed in the lower region or level 702 of the memory die 104 (FIG. 7A). The object of the tracks, then, is to deliver the voltages from the lower region 704 to the control gate layers disposed in the intermediate region 706 (FIG. 7A). In the example configuration in FIG. 10, the tracks extend from the row decoder 904 as conductive traces formed in one or more bottom metal layers in the lower region 704, and then extend as vertical interconnects in the z-direction through, while insulated from, the control gate layers up to one or more top metal layers in the upper region 708 (FIG. 7B), then extend laterally as traces formed in the one or more top metal layers, and the finally extend to vertical interconnects extending in the z-direction that contact respective control gate layers.

In general, a vertical interconnect (or just interconnect) is a conductive element that electrically connects, such as by physically contacting, two other conductive elements that are otherwise disconnected from each other. In the example embodiment of FIG. 10, one vertical interconnect of a track connects a trace in a bottom metal layer to a trace in a top metal layer, and a second vertical interconnect connects a trace in the top metal layer to a control gate layer.

In FIG. 10, each track includes at least four conductive elements, including a trace extending from a control gate switch in the row decoder 904 in a bottom metal layer, a vertical interconnect extending from the bottom metal layer through the control gate layers to a top metal layer, a trace extending in the top metal layer, and a vertical interconnect extending from the top metal layer to one of the control gate layers. Accordingly, the first track 1004 includes a first trace 1008 extending from a control gate switch of the row decoder 904 in a bottom metal layer; a first vertical interconnect 1110 that has a first end connected to an end of the first trace 1008 in the bottom metal layer and that vertically extends through the control gate layers up to the top metal layers; a second trace 1012 extending in a top metal layer that has a first end connected to a second end of the first vertical interconnect 1010; and a second vertical interconnect 1014 that has a first end connected to a second end of the second trace 1012 in the top metal layer and that extends to a second end that contacts one of the control gate layers. Similarly, the second track 1006 includes a first trace 1016 extending from a control gate switch of the row decoder 904 in a bottom metal layer; a first vertical interconnect 1118 that has a first end connected to an end of the first trace 1016 in the bottom metal layer and that vertically extends through the control gate layers up to the top metal layers; a second trace 1020 extending in a top metal layer that has a first end connected to a second end of the first vertical interconnect 1018; and a second vertical interconnect 1022 that has a first end connected to a second end of the second trace 1020 in the top metal layer and that extends to a second end that contacts one of the control gate layers.

The track region 1002 provides an area or volume for the tracks to extend, and includes the block and the regions above and below the block—i.e., it includes the lower, intermediate, and lower regions 704, 706, 708 of the memory die 104 (FIG. 7A). Additionally, since the tracks extend through and connect to the control gate layers of a block, the track region of a block includes portions of the control gate layers. In FIG. 10, the track region 1002 of the block includes three portions or regions of the control gate layers, including a subway region or portion 1024, a first terrace region or portion 1026, and a second terrace region or portion 1028. Other configurations may include only one terrace region.

The subway region 1024 of a block is a portion of the control gate layers that has extending through it the vertical interconnects of the tracks that connect the traces of the top and bottom metal layers. For example, FIG. 10 shows each of the first interconnect 1010 of the first track 1004 and the first interconnect 1018 of the second track 1006 extending through the subway region 1024.

The vertical interconnects extending through the subway region 1024 may extend through non-conductive vias or other non-conductive hole-like structures that insulate the vertical interconnects from the control gate layers through which they extend. FIG. 10 shows the interconnect 1010 insulated by a non-conductive via 1030, and the interconnect 1018 insulated by a non-conductive via 1032.

A terrace region of the track region 1002, otherwise referred to as a hookup region or area, is a portion of the control gate layers that comes into contact with the tracks, particularly the second vertical interconnects extending from the top metal layers to the control gate layers. A terrace region of a given control gate layer is alternatively referred to as a hookup region or area in that it is a region, or area, of the given control gate layer that hooks up (i.e., connects) a track with the given control gate layer. In the example configuration shown in FIG. 10, the terrace regions 1026, 1028 are defined by a gap or a void in the control gate layers that forms a terrace wall of the subway region 1024, and one or more staircase structures that exposes contact areas of the control gate layers for contact and electrical connection with the tracks. Accordingly, the first terrace region 1026 may include a staircase structure that provides a first set of contact areas of a first set of the control gate layers. A first set of tracks extending in the track region 1002 extends to and contacts the contact areas provided by the first terrace region 1026. The second terrace region 1028 may also include a staircase structure that provide a second set of contact areas of a second set of the control gate layers. A second set of tracks extending in the track region 1002 extends to and contacts the contact areas provided by the second terrace region 1028. The staircase structures of the two terrace regions 1010, 1012 may expose different control gate layers (or provide contact areas of different control gate layers) so that the tracks in the different sets contact different control gate layers.

As previously described with reference to FIGS. 7A-7D, memory cells of a three-dimensional block are three-dimensionally disposed around or about memory holes extending through the control gate layers and generally in planar alignment with the control gate layers to which they are biased. In the example configuration of FIG. 10, the track region 1002, including the subway region 1024 and the two terrace regions 1026, 1028 separate or divide the memory cells into two sets of memory cells or two memory cell regions, including a first memory cell region 1034 and a second memory cell region 1036. A memory cell region of a block is an area or volume that includes at least one memory cell of the block. Each memory cell of a block is part of or included in a memory cell region. Two memory cells of a block are part of the same memory cell region of the block if a shortest distance (or straight line) between the two memory cells does not cross or extend into a track region of the block. Conversely, two memory cells of a block are part of different memory cell regions of the block if a shortest distance (or straight line) between the two memory cells crosses or extends into a track region of the block. A set of memory cells of a block is a collection of memory cells that are disposed or located in the same memory cell region.

Figure 11:
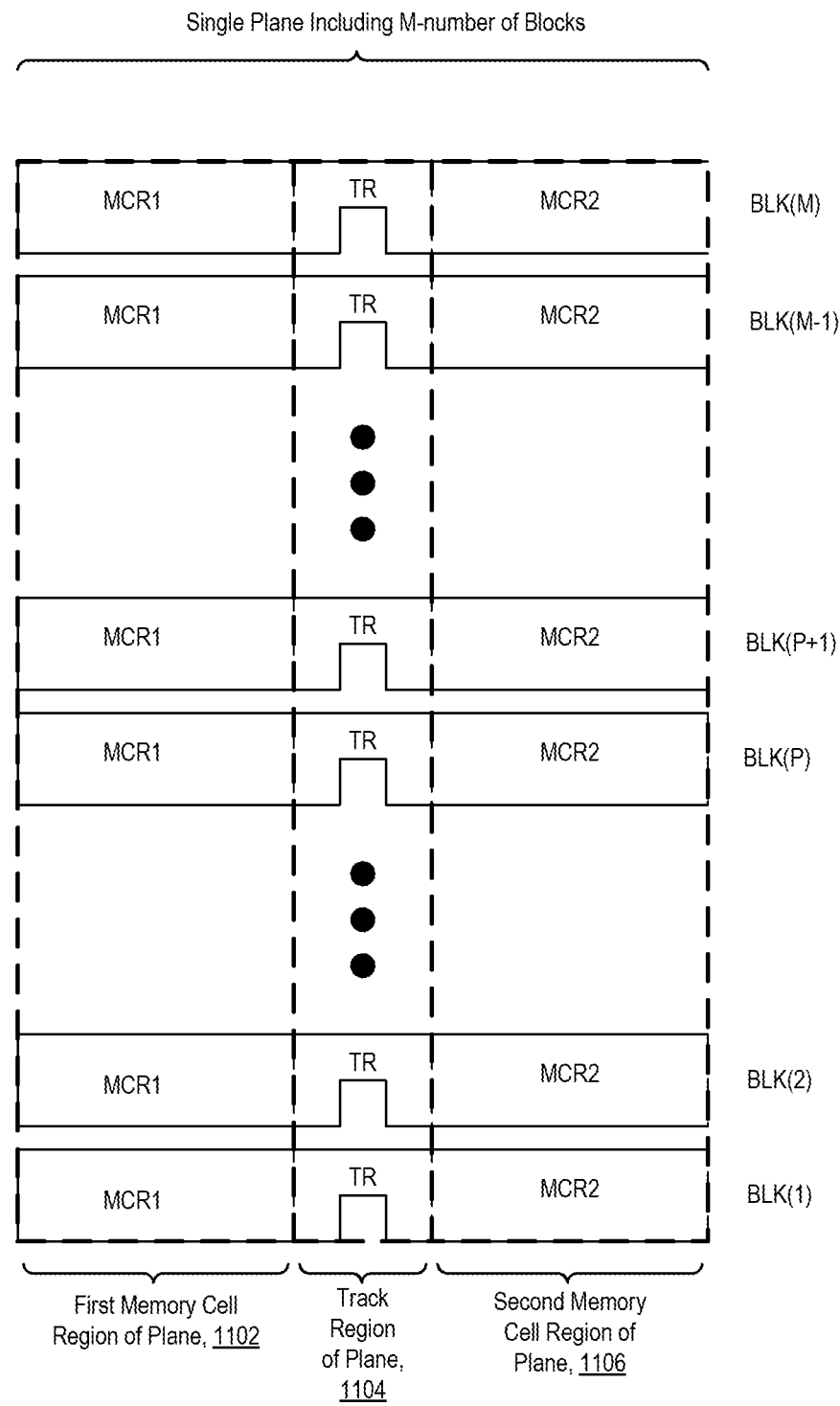
FIG. 11 is a top view of an intermediate region of a memory plane of blocks having a single track region configuration.

FIG. 11 shows a top view of an intermediate region (e.g., the intermediate region 706 of FIG. 7A) of a memory plane of an M-number of blocks BLK(1) to BLK(M) of a memory die, with each of the blocks having a single track region TR. That is, each of the blocks may have a stack of control gate layers configured like the stack 1000 of FIG. 10.

In a single memory plane, the memory regions and track regions may form memory cell and track regions on a plane level or basis, i.e., for the single plane. On a plane basis, the boundaries defining the memory cell and track regions extend across the blocks in the plane. As shown in FIG. 11, first memory cell regions MCR1 of the blocks BLK(1) to BLK(M) may define, form, and/or be disposed in a first memory cell region 1102 of the plane, the track regions TR of the blocks BLK(1) to BLK(M) may define, form, and/or be disposed in a track region 1104 of the plane, and the second memory cell regions MCR2 of the blocks BLK(1) to BLK(M) may define, form, and/or be disposed in a second memory cell region 1106 of the plane.

As previously described with respect to FIG. 7A, circuit components of the memory die 104 may be disposed beneath the blocks in the lower region (e.g., the lower region 704 of FIG. 7A) of the memory die. The circuit components may be either in-array components or out-of-array components of memory cell regions. The term "in-array" refers to a circuit component or a portion of a circuit component disposed within a vertical profile of a memory cell region on a plane level (e.g., one of the memory cell regions 1102 or 1106 of FIG. 11). The term "out-of-array" refers to a circuit component or a portion of a circuit component disposed outside of a vertical profile of a memory cell region on a plane level. A vertical profile of a memory cell region on a plane level is a volume that includes the memory cell region of a plane and sub-volumes directly above and directly below the memory cell region, where the sub-volumes directly above and directly below are bounded by the boundaries of the memory cell region as they vertically extend above and below the memory cell region.

Herein, a circuit component is an "in-array" circuit component of a memory cell region if at least a portion of the circuit component is within the vertical profile of the memory cell region. A circuit component is an "out-of-array" circuit component of a memory cell region if no portion of the circuit component is within the vertical profile of the memory cell region. If a circuit component is partially within a vertical profile of a memory cell region, the circuit component as a whole is referred to as an in-array circuit component of the memory cell region. However, the part of the circuit component that is not within the vertical profile of the memory cell region is referred to as an out-of-array part of the circuit component, while the part of the circuit component that is within the vertical profile is referred to as an in-array part of the circuit component.

Figure 12:
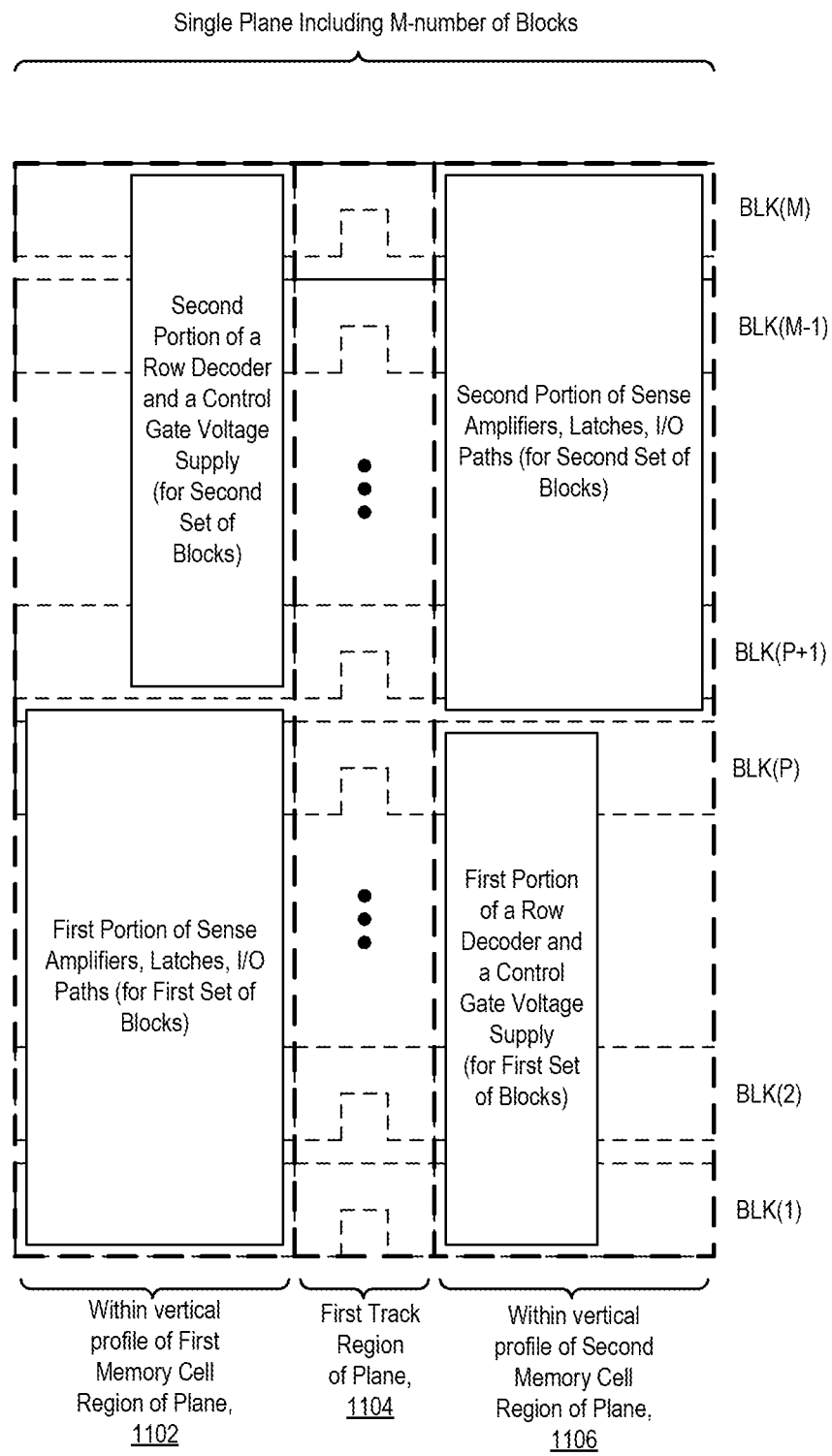
FIG. 12 is a top view of a physical layout of circuit components in a lower region of the memory plane of FIG. 11.

FIG. 12 shows a top view of a physical layout of circuit components in a lower region (e.g., the lower region 704 of FIG. 7A) of the memory plane of M blocks in FIG. 11. Looking at FIG. 11 or FIG. 12, the M-number of blocks are separated into two groups of P blocks, including a first set including blocks BLK(1) to BLK(P) and a second set including blocks BLK(P+1) to BLK(M). Referring particularly to FIG. 12, the sense amplifiers, latches and input/output (I/O) paths involved in memory operations performed on blocks of the memory plane in FIGS. 11 and 12 may be separated into two portions, including a first portion that is involved in memory operations performed on memory cells located in the first memory cell region 1102 and a second portion that is involved in memory operations performed on memory cells located in the second memory cell region 1106. The first portion is an in-array component of the first memory cell region 1102 and the second portion is an in-array component of the second memory cell region 1106.

In addition, a row decoder and control gate voltage supply used to generate and route voltages to the control gate layers may be separated into two portions, including a first portion that is configured to supply and route voltages to control gate layers of the first set of P blocks BLK(1) to BLK(P), and a second portion that is configured to supply and route voltages to control gate layers of the second set of P blocks BLK(P+1) to BLK(M). The first portion of the row decoder and control gate voltage supply are in-array components of the second memory cell region 1106, and the second portion of the row decoder and control gate voltage supply are in-array components of the first memory cell region 1102.

As previously described, the number of tracks connecting to the control gate layers of a block is equal or proportionate to the number of control gate layers of the block to be biased. The more control gate layers to be biased, the more tracks that are needed to connect to those control gate layers.

Two memory cell regions separated by a track region may define a width of the track region. In particular, a given track region may have two boundaries with the two memory cell regions it separates. For example, referring to FIG. 10, a first boundary 1038 may be a dividing line between the first track region 1002 and the first memory cell region 1034, and a second boundary 1040 may be a dividing line between the first track region 1002 and the second memory cell region 1036. A width of the first track region 1002 is a distance from the first boundary 1038 to the second boundary 1040.

A minimum width that a track region may have may be dependent on the number of tracks extending in the track region and a pitch of the tracks, which, for a given track, is a sum of the width of the track and a required spacing between the track and another track extending in the track region. In order to increase the number of tracks that extend in a track region while keeping the width of the track region constant (or even decreasing the width of the track region), one option is to decrease the pitch of the tracks. However, decreasing the pitch may require new manufacturing tooling used to form the tracks, which may be costly and generally undesirable from a design and/or production standpoint.

Another option, as described in further detail below, is to route some tracks outside of the track region. A track that extends or that is routed outside of a track region is a track that does not have any of its portions or elements disposed in the track region. A plurality of tracks configured to connect to and bias a stack of control gate layers of a block may include a first set extending in the track region to connect to and bias a first set of control gate layers of the stack, and a second set extending outside of the track region to connect to and bias a second set of the control gate layers of the stack.

One way to route some tracks outside of the track region is to add or increase the number of track regions per block and/or per plane and route some of the plurality of tracks into the additional track region (or track regions). In other words, by adding a second track region, those tracks that extend in the second track region to connect to the control gate layers are effectively extending outside of the first track region from the row decoder to the control gate layers of the stack. Increasing the number of track regions per block and/or per plane may decrease or at least keep constant the number of tracks extending in a given track region, while allowing for an increase in a total number of tracks connecting to control gate layers of a given block or of a given memory plane. Routing at least some of the tracks into additional track regions to decrease the number of tracks extending in a given track region may be referred to as "relaxing" the constraints of the track routing.

Figure 13:
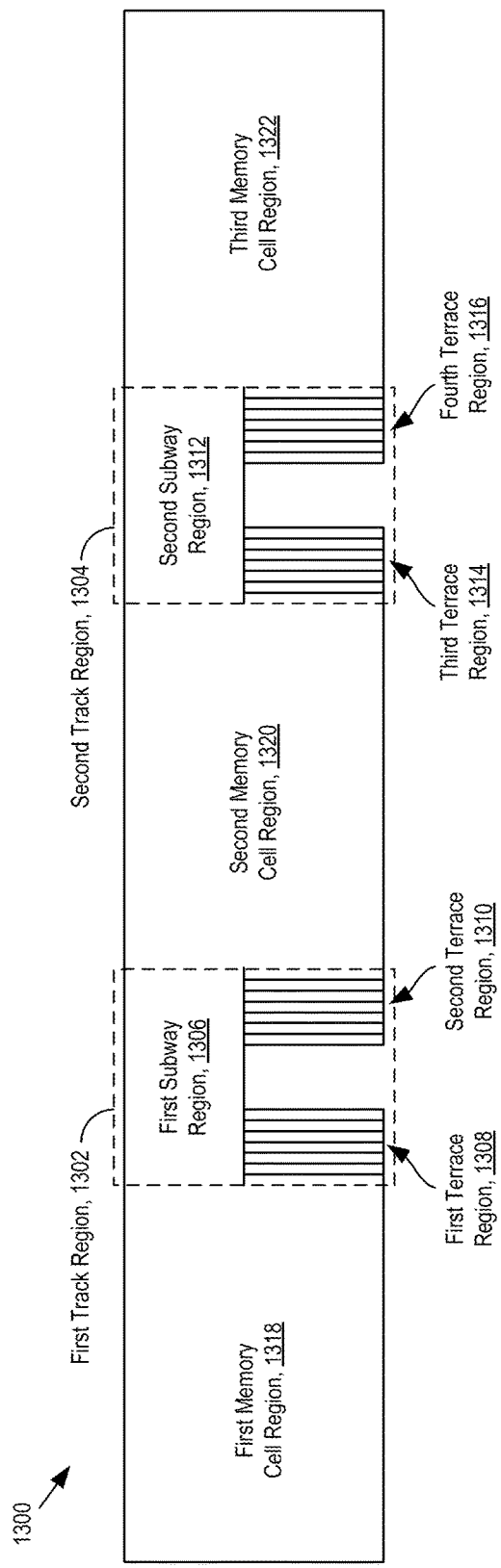
FIG. 13 is a top view of a stack of control gate layers that form part of multiple track regions.

FIG. 13 is a top view of an example configuration of a stack 1300 of control gate layers of a block having portions that are part of multiple track regions. The example stack 1300 of FIG. 13 may be similar to the configuration in FIG. 10, except that instead of its the control gate layers including portions that are part of only a single track region, the stack 1300 includes portions that are part of two track regions, including a first track region 1302 and a second track region 1304. By being part of two track regions, the number of subway regions and the number of terrace regions each double compared to the configuration of FIG. 10. Accordingly, the stack 1300 of control gate layers includes a first subway region 1306, a first terrace region 1308 and a second terrace region 1310 that are part of the first track region 1302, and a second subway region 1312, a third terrace region 1314, and a fourth terrace region 1316 that are part of the second track region 1304. Additionally, the two track regions 1302, 1304 may separate the memory cells of the block into three memory cell regions, including a first memory cell region 1318, a second memory cell region 1320, and a third memory cell region 1322.

For a given block having the configuration of the stack 1300, for a total number of tracks to connect to the control gate layers of the stack 1300, a first set of the tracks may extend in the first track region 1302 and connect to a first set of the control gate layers at the first and second terrace regions 1308, 1310, and a second set of the tracks may extend in the second track region 1302 and connect to a second set of the control gate layers at the third and fourth terrace regions 1314, 1316. Other two track region configurations may have only three terrace regions instead of four. In general, increasing the number of track regions per block may provide at least one additional terrace region for tracks extending to the block to contact.

The terrace regions may be configured in any of various ways in order to form the first and second sets of control gate layers to which the first and second sets of tracks contact. FIG. 12 shows an example configuration of four terrace regions where the first and second sets of control gate layers are determined according to the relative height of the control gate layers in a stack. The height of a control gate layer in a stack refers to its relative positioning in the stack in the z-direction. The farther away a control gate layer in a stack is from the substrate 702 (FIG. 7A), the higher it is in the stack, or the greater its height. Likewise, the closer a control gate layer in a stack is to the substrate 702, the lower it is in the stack, or the lower its height. Where the control gate layers of a stack are grouped into a first set and a second set according to height, the first set of control gate layers may be an upper set of control gate layers and the second set of control gate layers may be a lower set of control gate layers. Each control gate layer in the upper set of control gate layers is higher in the stack than each of the control gate layers in the lower set of control gate layers.

Figure 14:
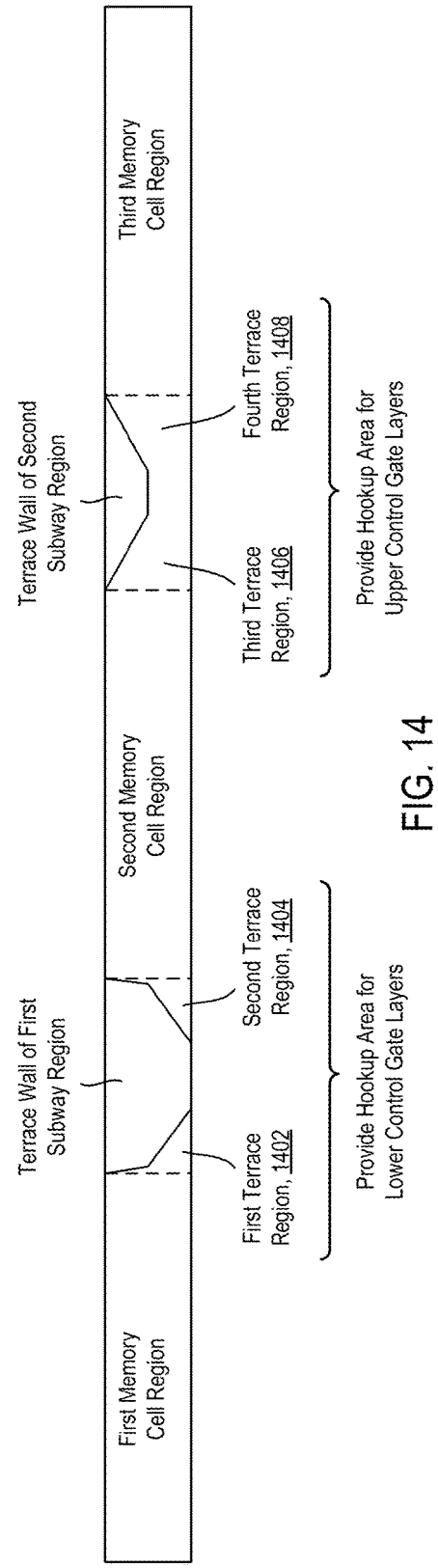
FIG. 14 is a side view of the stack of FIG. 13, illustrating example terrace regions of upper and lower control gate layers.

FIG. 14 shows a side view of an example terrace configuration of the stack 1300 of FIG. 11. The four terrace regions 1202, 1204, 1206, 1208 may be representative of the four terrace regions 1102, 1104, 1106, 1108 of the stack 1100 of FIG. 11. In the example configuration of FIG. 12, the first and second terrace regions 1202, 1204 are formed (e.g., their respective staircase structures are formed) to expose or provide contact or hookup areas of a lower set of the control gate layers, and the third and fourth terrace regions 1206, 1208 are formed (e.g., their respective staircase structures are formed) to expose or provide contact or hookup areas of an upper set of the control gate layers. Other terrace region configurations, other than those determined according to height, may be possible.

In general, increasing the number of track regions per block may provide a larger volume per block in which to route the tracks, which in turn can allow for a larger number of tracks per block to extend in the track regions and connect to the control gate layers of the block without having to decrease the pitch of the tracks. Accordingly, increasing the number of track regions per block may be a desirable solution for design specifications requiring an increased number of control gate layers of a block or a plurality of blocks in a memory plane.

Figure 15:
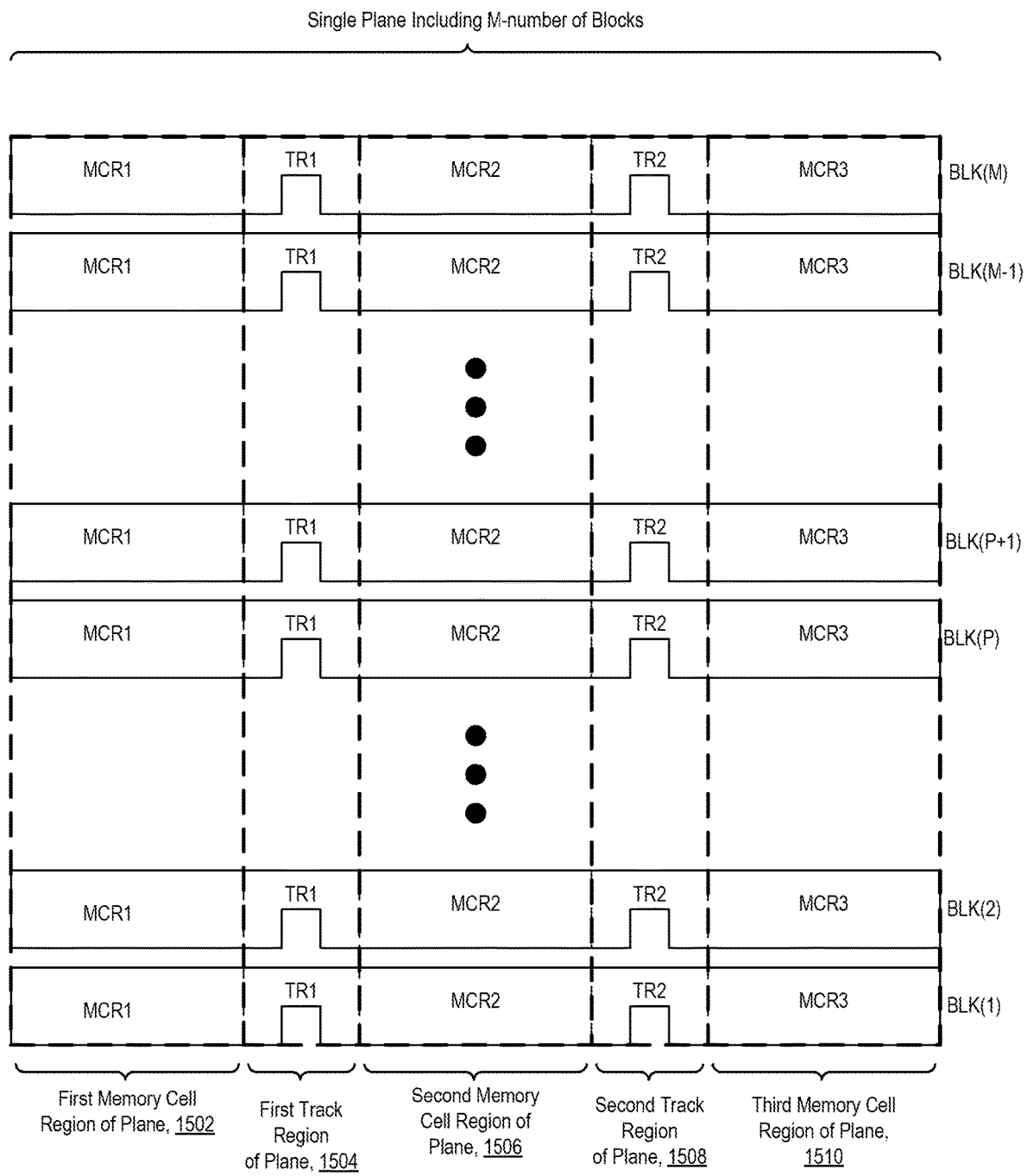
FIG. 15 is a top view of an intermediate region of a memory plane of blocks having a two track region configuration.

FIG. 15 shows a top view of an intermediate region (e.g., intermediate region 706 of FIG. 7A) of a memory plane of an M-number of blocks BLK(1) to BLK(M) of a memory die, with each of the blocks having two track region TR1, TR2. That is, each of the blocks BLK(1) to BLK(M) may have a stack of control gate layers configured like the stack 1300 of FIG. 13.

As previously described with reference to FIG. 11, block-level memory cell regions and track regions of a plurality of blocks of a single plane may form memory cell and track regions on a plane level or basis, i.e., for the single plane. On a plane level, the boundaries defining the memory cell and track regions extend across the blocks in the plane. As shown in FIG. 15, first memory cell regions MCR1 of the blocks BLK(1) to BLK(M) may define, form, and/or be disposed in a first memory cell region 1502 of the plane, the first track regions TR1 of the blocks BLK(1) to BLK(M) may define, form, and/or be disposed in a first track region 1504 of the plane, the second memory cell regions MCR2 of the blocks BLK(1) to BLK(M) may define, form, and/or be disposed in a second memory cell region 1506 of the plane, the second track regions TR2 of the blocks BLK(1) to BLK(M) may define, form, and/or be disposed in a second track region 1508 of the plane, and the third memory cell regions MCR3 of the blocks BLK(1) to BLK(M) may define, form, and/or be disposed in a third memory cell region 1510 of the plane.

Figure 16:
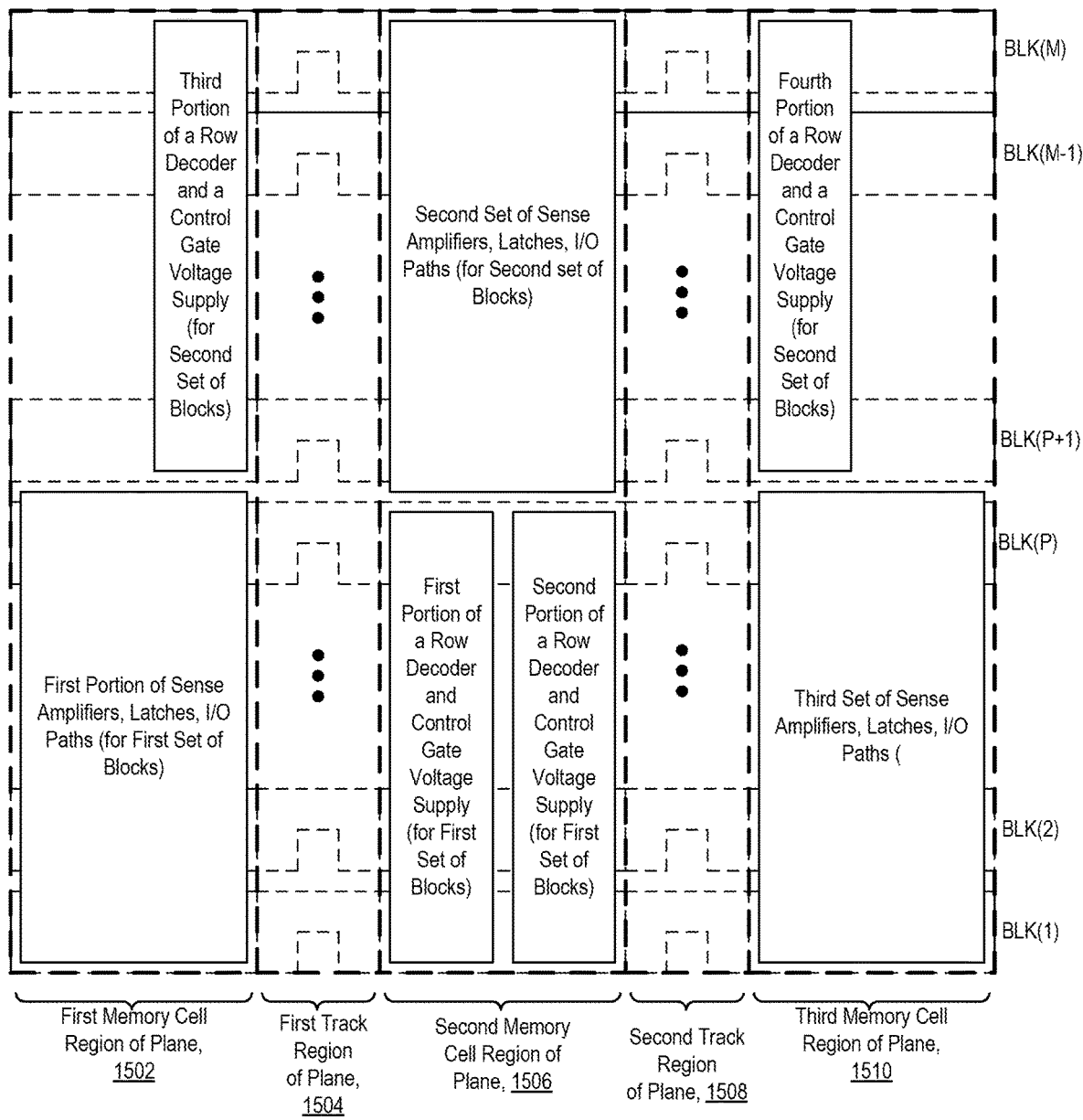
FIG. 16 is a top view of a physical layout of circuit components in a lower region of the memory plane of FIG. 15.

FIG. 16 shows a top view of a physical layout of circuit components in a lower region (e.g., the lower region 704 of FIG. 7A) of the plane of M blocks in FIG. 15. Looking at FIG. 15 or FIG. 16, the M-number of blocks are separated into two groups of P blocks, including a first set including blocks BLK(1) to BLK(P) and a second set including blocks BLK(P+1) to BLK(M) (just as they were with FIGS. 11 and 12). Referring particularly to FIG. 16, the sense amplifiers, latches, and I/O paths may be separated into three portions corresponding to the three memory cell regions. A first portion may be an in-array component of the first memory cell region 1502 and configured to perform memory operations associated with memory cells in the first memory cell region 1502, a second portion may be in an-array component of the second memory cell region 1506 and configured to perform and/or be involved in memory operations associated with memory cells in the second memory cell region 1506, and a third portion may be an in-array component of the third memory cell region 1510 and configured to perform and/or be involved in memory operations associated with memory cells in the third memory cell region 1510.

In addition, the row decoder and the control gate voltage supply may be separated into four portions, with each portion configured to generate and route voltages to one of four sets of tracks. Each set of the four sets is connected to an associated one of four different sets of terrace or hookup regions. Each of the sets of terrace regions is associated with, located in, and/or part of one of the two terrace regions 1504, 1508 and one of the two block sets. A first set of terrace regions is part of the first track region 1504 and part of the first set of blocks BLK(1) to BLK(P), a second set of terrace regions is part of the second track region 1508 and part of the first set of blocks BLK(1) to BLK(P), a third set of terrace regions is part of the first track region 1504 and part of the second set of blocks BLK(P+1) to BLK(M), and a fourth set of terrace regions is part of the second track region 1508 and part of the second set of blocks BLK(P+1) to BLK(M). The row decoder and control gate power supply may include a first portion that generates and routes voltages to tracks connected to the first set of terrace regions, a second portion that generates and routes voltages to tracks connected to the second set of terrace regions, a third portion that generates and routes voltages to tracks connected to the third set of terrace regions, and a fourth portion that generates and routes voltages to tracks connected to the fourth set of terrace regions.

In addition, the first and second portions may be in-array components of the second memory cell region 1506, the third portion may be an in-array component of the third memory cell region 1502, and the fourth portion may be an in-array component of the fourth memory cell region 1510. In some example configurations, a larger proportion or percentage of the row decoder portions may be within the vertical profiles of the three memory cell regions 1502, 1506, 1510 of the two track region configurations described with reference to FIGS. 13-16 compared to the proportion or percentage of the row decoder portions within the vertical profiles of the memory cell regions 1034/1102, 1036/1106 described with reference to FIGS. 10-12.

Figure 17:
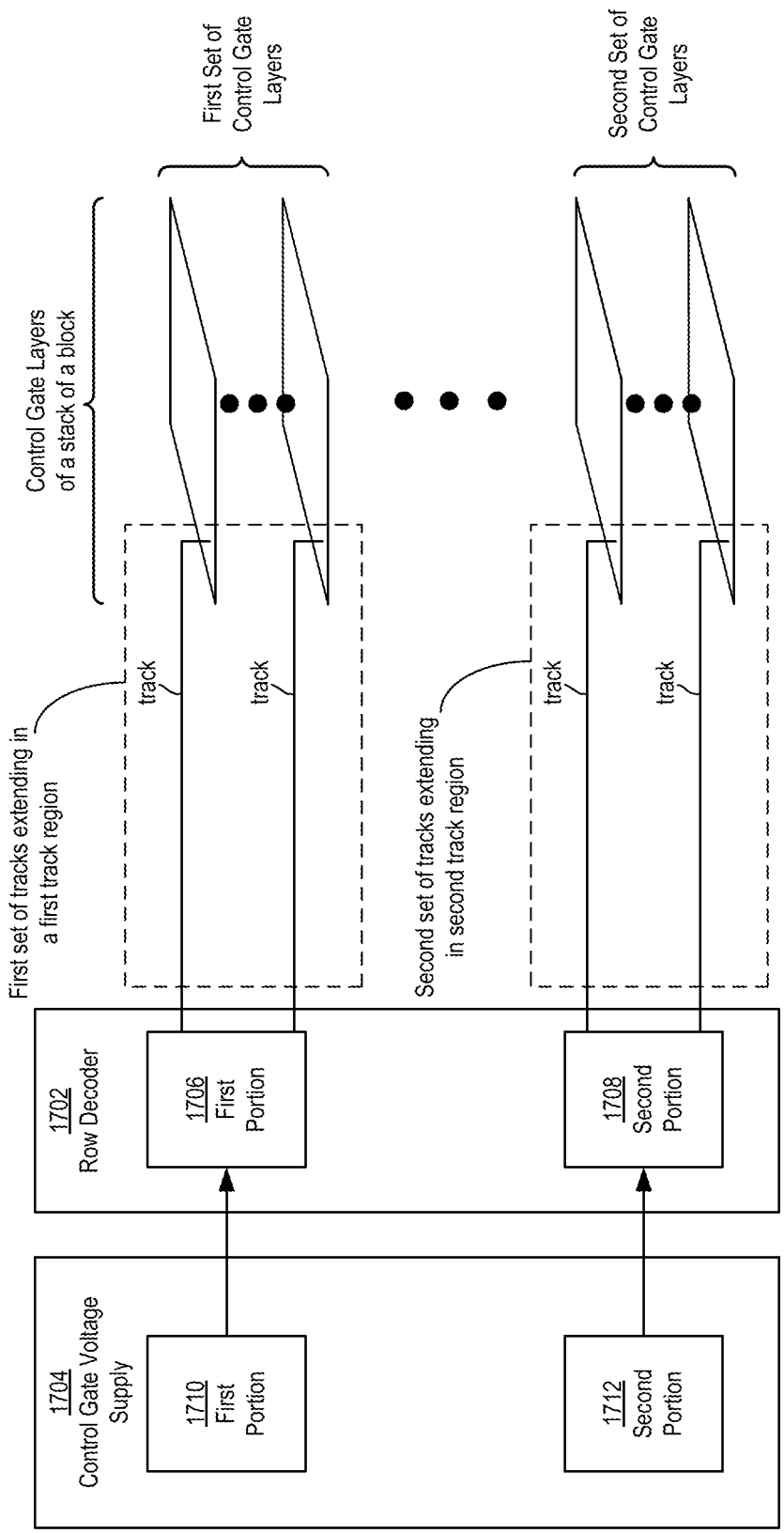
FIG. 17 is a block diagram of a row decoder and a control gate voltage supply configured to output a plurality of voltages to a plurality of control gate layers of a block having a two track region configuration.

FIG. 17 shows a block diagram of a row decoder 1702 and a control gate voltage supply 1704 configured to output or supply a plurality of voltages to a stack of control gate layers of a block in accordance with the two track region configuration described with reference to FIGS. 13-16. The row decoder 1702 may be configured to output a first set of the plurality of voltages to a first set of the control gate layers of the stack by way of a first set of tracks that extend through a first track region. In addition, the row decoder 1702 may be configured to output a second set of the plurality of voltages to a second set of the control gate layers of the stack by way of a second set of tracks that extend through a second track region. Physically, each of the first track region through which the first set of tracks extends and the second track region through which the second set of tracks extend may be similar to the track region 1002 of FIG. 10. In addition, the first and second sets of control gate layers may correspond to a height of the stack. For example, the first set of control gate layers may be upper control gate layers of the stack, and the second set of control gate layers may be lower control gate layers of the stack, as previously described with reference to FIG. 14.

In some example configurations, the row decoder 1702 may be separated into portions, including a first portion 1706 configured to output the first set of voltages and a second portion 1708 configured to output the second set of voltages. In accordance with the physical layout of FIG. 16, where the block is part of the first set of P blocks BLK(1) to BLK(P), the first and second portions 1706, 1708 may be in-array components of the same memory cell region, such as the second memory cell region 1506, as shown in FIG. 16. Alternatively, where the block is part of the second set of P blocks BLK(P+1) to BLK(M), the first and second portions 1706, 1708 may be in-array components of different memory cell regions, such as the first and third memory cell regions 1502, 1510, as shown in FIG. 16.

The row decoder 1702 may be configured to output the plurality of voltages in response to receipt of at least one voltage received from the control gate supply 1704. Similar to the row decoder 1702, the control gate voltage supply 1704 may include a plurality of portions, including a first portion 1710 and a second portion 1712. The first portion 1710 may be configured to output or supply at least one voltage to the first portion 1706 of the row decoder 1702, and the second portion 1712 may be configured to output or supply at least one voltage to the second portion 1708 of the row decoder 1702. In accordance with the physical layout of FIG. 16, where the block is part of the first set of P blocks BLK(1) to BLK(P), the first and second portions 1710, 1712 may be in-array components of the same memory cell region, such as the second memory cell region 1506, as shown in FIG. 16. Alternatively, where the block is part of the second set of P blocks BLK(P+1) to BLK(M), the first and second portions 1710, 1712 may be in-array components of different memory cell regions, such as the first and third memory cell regions 1502, 1510, as shown in FIG. 16.

As previously described, the row decoder 1702 may be configured in various states at various times in order to route voltages to the different control gate layers of the stack in order to perform various memory operations (read, program, erase, etc.). Accordingly, in some example methods of operation, in order to perform or carry out a first memory operation (read, program, erase, etc.) on the block, the first row decoder portion 1706 may output a first control gate voltage associated with the first memory operation. A first track of the first set coupled to the first portion 1706 may supply the first control gate voltage through the first track region to a first control gate layer of the first set of control gate layers in order to bias the first control gate layer with the first control gate voltage. In addition, in order to perform or carry out a second memory operation (read, program, erase, etc.) on the block, such as at a different time than the first memory operation, the second row decoder portion 1708 may output a second control gate voltage associated with the second memory operation. A second track of the second set coupled to the second portion 1708 may supply the second control gate voltage through the second track region to a second control gate layer of the second set of control gate layers in order to bias the second control gate layer with the second control gate voltage.

FIG. 18 shows a block diagram of a row decoder 1802 and a control gate voltage supply 1804 configured to output or supply a plurality of voltages to control gate layers of a plurality of stacks of a plurality of blocks of a memory plane in accordance with the two track region configuration described with reference to FIGS. 13-17. On a plane level, the terrace or hookup regions in the plane may be organized, arranged, or grouped into a plurality of sets, such as four sets corresponding to the physical layout of FIG. 16. The four sets of hookup regions may include a first set of hookup regions part of a first set of P blocks BLK(1) to BLK(P) of the memory plane and disposed in a first track region, such as the first track region 1504 of FIGS. 15 and 16; a second set of hookup regions part of the first set of P blocks BLK(1) to BLK(P) of the memory plane and disposed in a second track region, such as the second track region 1508 of FIGS. 15 and 16; a third set of hookup regions part of the second set of P blocks BLK(P+1) to BLK(M) of the memory plane and disposed in the first track region; and a fourth set of hookup regions part of the second set of P blocks BLK(P+1) to BLK(M) of the memory plane and disposed in the second track region.

The row decoder 1802 may be configured to output a first set of the plurality of voltages to the first set of hookup regions of the plane by way of a first set of tracks that extend through the first track region and connect to the first set of hookup regions. In addition, the row decoder 1802 may be configured to output a second set of the plurality of voltages to the second set of the hookup regions of the plane by way of a second set of tracks that extend through the second track region and connect to the second set of hookup regions. The row decoder 1802 may also be configured to output a third set of the plurality of voltages to the third set of hookup regions of the plane by way of a third set of tracks that extend through the first track region and connect to the third set of hookup regions. Further, the row decoder 1802 may be configured to output a fourth set of the plurality of voltages to the fourth set of the hookup regions of the plane by way of a fourth set of tracks that extend through the second track region and connect to the fourth set of hookup regions.

In some example configurations, the row decoder 1802 may be separated into portions, including a first portion 1806 configured to output the first set of voltages, a second portion 1808 configured to output the second set of voltages, a third portion 1810 configured to output the third set of voltages, and a fourth portion 1814 configured to output the fourth set of voltages. In accordance with the physical layout of FIG. 16, the first and second portions 1806, 1808 may be in-array components of the same memory cell region, such as the second memory cell region 1506, as shown in FIG. 16, and the third and fourth portions 1810, 1812, may be in-array components of different memory cell regions, such as the first and third memory cell regions 1502, 1510, as shown in FIG. 16.

A means for biasing a three-dimensional block of memory cells, in various embodiments, may include a stack of control gate layers, such as the stack 710, one of the stacks in the blocks BLK(1) to BLK(M) in FIG. 9, the stack 1000 of FIG. 10, the stacks of the blocks BLK(1) to BLK(M) in FIGS. 11 and 12, the stack 1300 in FIGS. 13 and 14, the stacks of the blocks BLK(1) to BLK(M) in FIGS. 15 and 16, the stack of the block in FIG. 17, and/or the stacks of the first and second sets of blocks in FIG. 18, or the like. Other embodiments may include similar or equivalent means for biasing a three-dimensional block of memory cells.

A means for separating the block of memory cells into a first memory cell region and a second memory cell region; from the second set of memory cells may include a first track region, such as the track region 1002 of FIG. 10, the track region 1104 of FIGS. 11 and 12, the first track region 1302 of FIGS. 13 and 14, the first track region 1504 of FIGS. 15 and 16, the first track region in FIG. 17, and/or the first track region in FIG. 18, or the like. Other embodiments may include similar or equivalent means for separating the block of memory cells into first and second memory cell regions.

A means for separating the block of memory cells into the second memory cell region and a third memory cell region may include a second track region, such as the second track region 1304 of FIGS. 13 and 14, the second track region 1508 of FIGS. 15 and 16, the second track region of FIG. 17, and/or the second track region in FIG. 18, or the like. Other embodiments may include similar or equivalent means for separating the block of memory cells into second and third memory cell regions.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. An apparatus comprising:
   a stack comprising a plurality of control gate layers;
   a first set of memory cells configured to be biased by the stack of control gate layers;
   a second set of memory cells configured to be biased by the stack of control gate layers;
   a first track region separating the first set of memory cells from the second set of memory cells;
   a first set of tracks extending in the first track region and configured to bias a first set of control gate layers of the stack of control gate layers; and
   a second set of tracks extending in a second track region separate from the first track region and configured to bias a second set of control gate layers of the stack of the control gate layers.

2. The apparatus of claim 1, further comprising a third set of memory cells configured to be biased by the stack of control gate layers, wherein the second track region separates the second set of memory cells from the third set of memory cells.

3. The apparatus of claim 2, wherein the second set of tracks extends through the second track region.

4. The apparatus of claim 1, further comprising:
   a row decoder comprising:
      a first portion configured to supply a first set of voltages to the first set of tracks; and
      a second portion configured to supply a second set of voltages to the second set of tracks.

5. The apparatus of claim 4, wherein the first portion and the second portion are in-array components of a same memory cell region in which the second set of memory cells are disposed.

6. The apparatus of claim 5, wherein the first portion and the second portion are in-array components of different memory cell regions.

7. The apparatus of claim 1, wherein the first set of control gate layers comprises an upper set of control gate layers of the stack and the second set of control gate layers comprises a lower set of control gate layers of the stack.

8. An apparatus comprising:
   a stack comprising a plurality of control gate layers configured to bias a plurality of memory cells; and
   a row decoder configured to:
      output a first set of voltages to a first set of the control gate layers of the stack by way of a first set of tracks extending through a first track region; and
      output a second set of voltages to a second set of control gate layers of the stack by way of a second set of tracks extending through a second track region separate from the first track region.

9. The apparatus of claim 1, wherein the row decoder comprises:
a first portion configured to output the first set of voltages; and
a second portion configured to output the second set of voltages.

10. The apparatus of claim 9, wherein the first portion and the second portion are in-array components of a same memory cell region.

11. The apparatus of claim 9, wherein the first portion and the second portion are in-array components of different memory cell regions.

12. The apparatus of claim 9, wherein the stack comprises a first stack, wherein the apparatus further comprises a second stack of control gate layers, and wherein the row decoder further comprises:
a third portion configured to output a third set of voltages to a first set of control gate layers of the second stack by way of a third set of tracks extending through the first track region.

13. The apparatus of claim 12, wherein the row decoder further comprises:
a fourth portion configured to output a fourth set of voltages to a second set of control gate layers of the second stack.

14. The apparatus of claim 13, wherein the third portion and the fourth portion are in-array components of different memory cell regions.

15. The apparatus of claim 14, wherein the third portion and the fourth portion are each in-array components of memory cell regions different from the memory cell regions of which the first and second portions are in-array components.

16. The apparatus of claim 8, wherein the first set of control gate layers comprises an upper set of control gate layers of the stack and the second set of control gate layers comprises a lower set of control gate layers of the stack.

17. A method comprising:
outputting, with a first row decoder portion, a first control gate voltage associated with a first memory operation;
supplying, with a first track coupled to the first row decoder portion, the first control gate voltage through a first track region to a first control gate layer of a stack;
outputting, with a second row decoder portion, a second control gate voltage associated with a second memory operation; and
supplying, with a second track coupled to the second row decoder, the second control gate voltage through a second track region to a second control gate layer of the stack,
wherein the first track region is separate from the second track region.

* * * * *